(12) United States Patent
Ohtani

(10) Patent No.: US 6,674,136 B1
(45) Date of Patent: Jan. 6, 2004

(54) SEMICONDUCTOR DEVICE HAVING DRIVER CIRCUIT AND PIXEL SECTION PROVIDED OVER SAME SUBSTRATE

(75) Inventor: Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/515,821

(22) Filed: Feb. 29, 2000

(30) Foreign Application Priority Data

Mar. 4, 1999 (JP) .......................................... 11-057754

(51) Int. Cl.$^7$ ............................................. H01L 29/76
(52) U.S. Cl. ...................... 257/408; 257/344; 257/336; 257/66; 257/79; 257/82
(58) Field of Search ............................. 257/79, 82, 66, 257/336, 344, 408

(56) References Cited

U.S. PATENT DOCUMENTS

| | | | | |
|---|---|---|---|---|
| 5,250,835 A | * | 10/1993 | Izawa | 257/408 |
| 5,254,865 A | * | 10/1993 | Koshimaru | 257/344 |
| 5,323,042 A | * | 6/1994 | Matsumoto | 257/350 |
| 5,352,620 A | * | 10/1994 | Komori et al. | 437/52 |
| 5,412,493 A | * | 5/1995 | Kunii et al. | 359/59 |
| 5,508,209 A | * | 4/1996 | Zhang et al. | 438/162 |
| 5,594,569 A | | 1/1997 | Konuma et al. | |
| 5,608,251 A | * | 3/1997 | Konuma et al. | 257/337 |
| 5,643,826 A | | 7/1997 | Ohtani et al. | |
| 5,767,930 A | | 6/1998 | Kobayashi et al. | |
| 5,858,823 A | | 1/1999 | Yamazaki et al. | |
| 5,923,962 A | | 7/1999 | Ohtani et al. | |
| 6,146,930 A | * | 11/2000 | Kobayashi et al. | 438/154 |
| 6,166,397 A | | 12/2000 | Yamazaki et al. | |
| 6,166,414 A | | 12/2000 | Miyazaki et al. | |
| 6,259,120 B1 | | 7/2001 | Zhang et al. | |
| 6,297,094 B1 | * | 10/2001 | Matsubara et al. | 438/257 |
| 6,297,862 B1 | * | 10/2001 | Murade | 349/44 |

FOREIGN PATENT DOCUMENTS

| | | |
|---|---|---|
| JP | 7-130652 | 5/1995 |
| JP | 9-312260 | 12/1997 |

OTHER PUBLICATIONS

U.S. Ser. No. 09/190,618 filed Nov. 12, 1998, Specification, Claims, Abstract, and Official Filing Receipt.
Related Application Ser. No. 09/502,675 filed Feb. 11, 2000.
Related Application Ser. No. 09/510,734 filed Feb. 22, 2000.
Mutsuko Hatano et al., 1997 IEEE, IEDM 97, 523–526.
Furue et al., "Charcteristics and Driving Scheme of Polymer–Stabilized Monostable FLCD Exhibiting Fast Response Time and High Contrast Ratio with Gray–Scale Capability", SID 98 Digest, pp. 782–785.
Yoshida et al., "A Full–Color Thresholdless Antiferroelectric LCD Exhibiting Wide Viewing Angle with Fast Response Time", SID 98 Digest, pp. 841–844.
Inui et al., "Thresholdless Antiferroelectricity in liquid crystals and its application to displays", J. Mater. Chem., 1996, 6(4), pp. 671–673.
Shimokawa et al., "Characterization of High–Efficiency Cast–Si Solar Cell Wafers by MBIC Measurement", Japanese Journal of Applied Physics, vol. 27, No. 5, May, 1998, pp. 751–758.

* cited by examiner

Primary Examiner—Eddie Lee
Assistant Examiner—Eugene Lee
(74) Attorney, Agent, or Firm—Eric J. Robinson; Robinson Intellectual Property Law Office, P.C.

(57) ABSTRACT

In a manufacturing method of an active matrix type liquid crystal display device, a semiconductor device having good TFT characteristics is realized. LDD regions of a driver circuit NTFT and LDD regions of a pixel section NTFT are given different impurity concentration. An impurity is doped at differing concentrations using a mask. Thus a liquid crystal display device provided with a driver circuit having high speed operation and a pixel section with high reliability can be obtained.

12 Claims, 16 Drawing Sheets

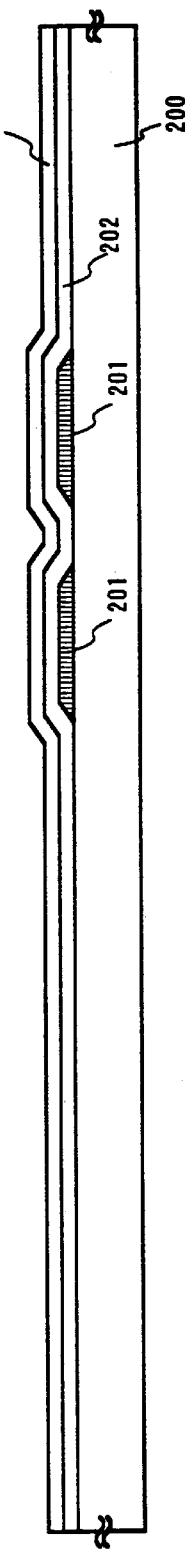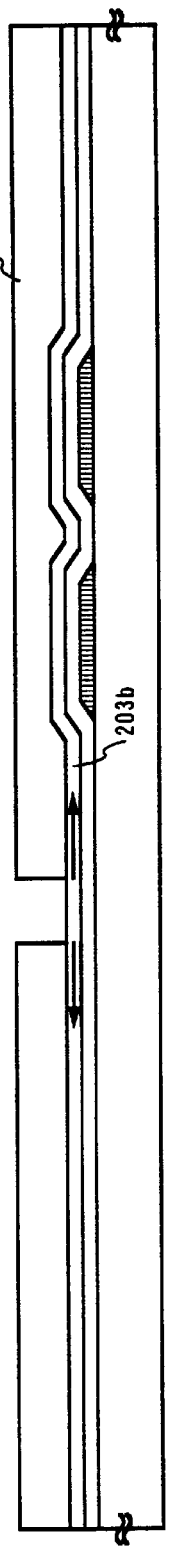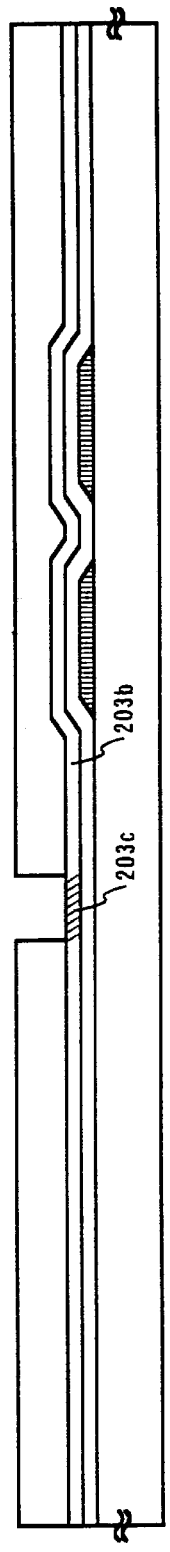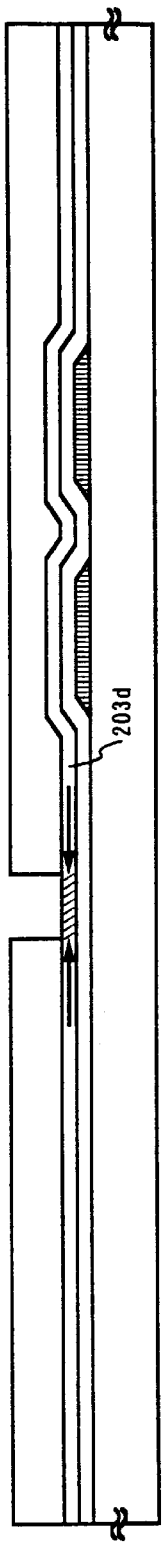

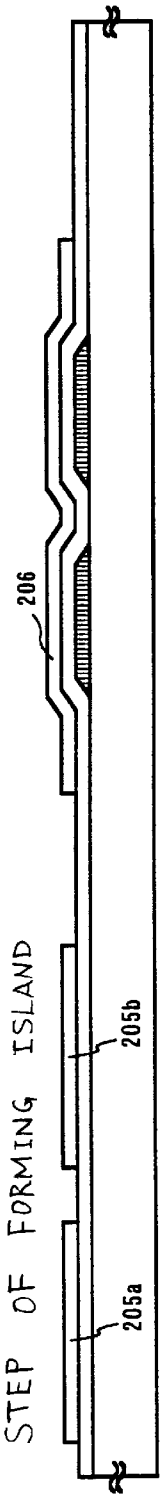
Fig. 3A STEP OF FORMING ISLAND
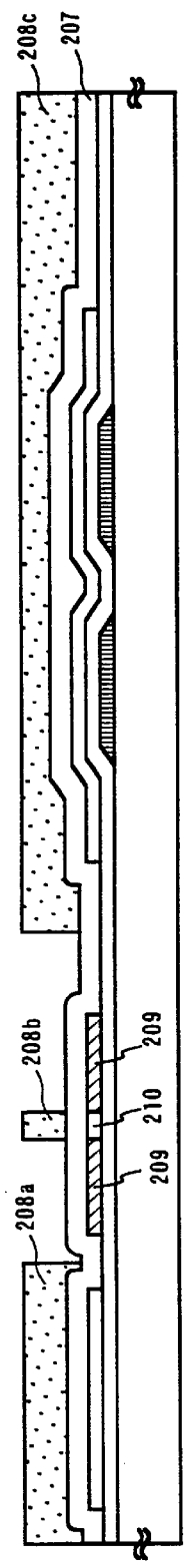
Fig. 3B STEP OF DOPING IMPURITY (STEP OF FORMING n⁻ REGION OF DRIVER CIRCUIT)
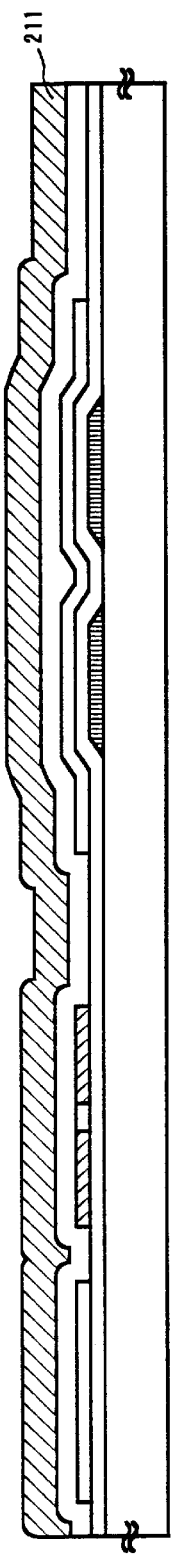
Fig. 3C STEP OF FORMING CONDUCTIVE FILM
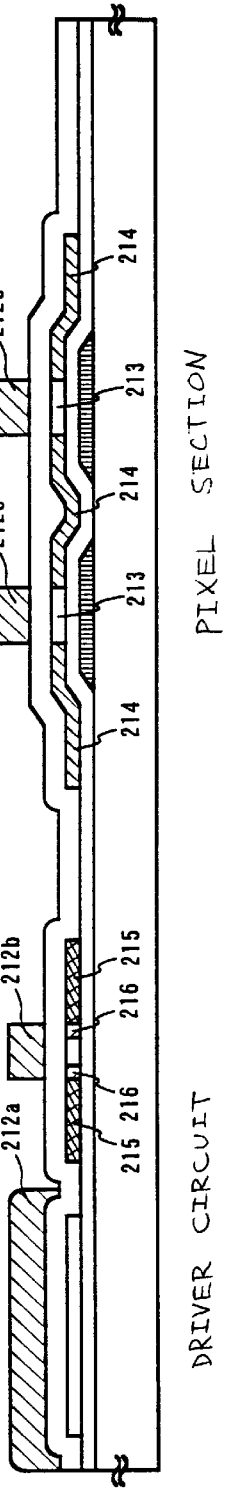
Fig. 3D STEP OF DOPING IMPURITY (STEP OF FORMING n⁻ REGION OF PIXEL SECTION)

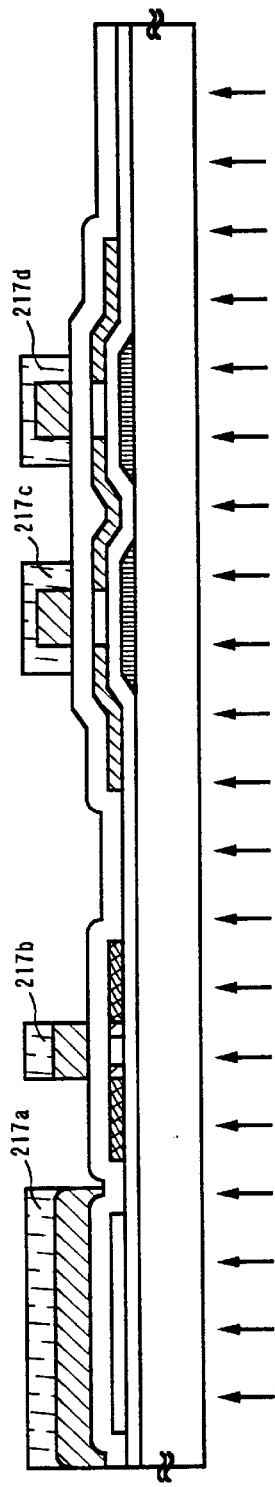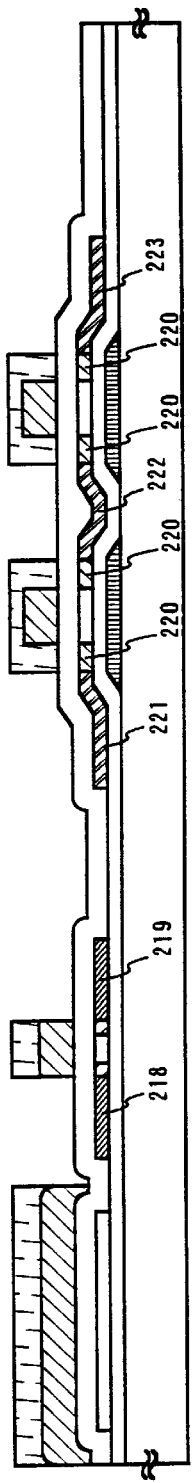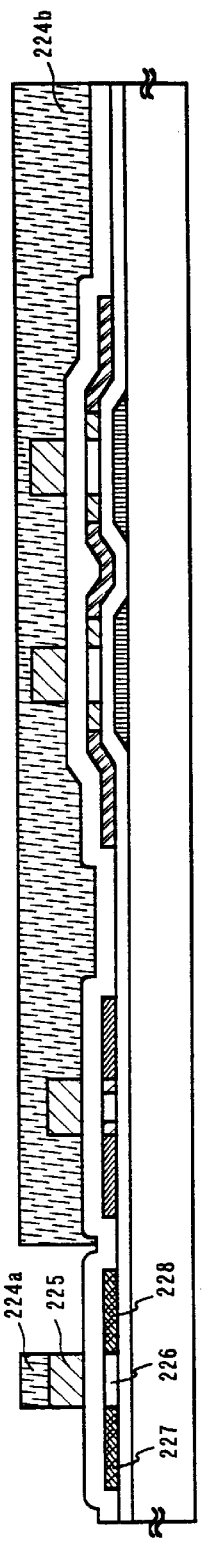

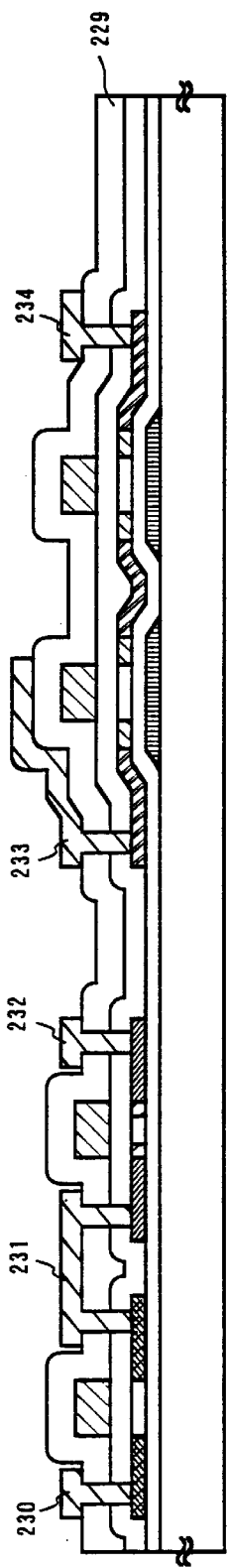
Fig. 5A STEP OF FORMING INTERLAYER INSULATING FILM AND WIRING
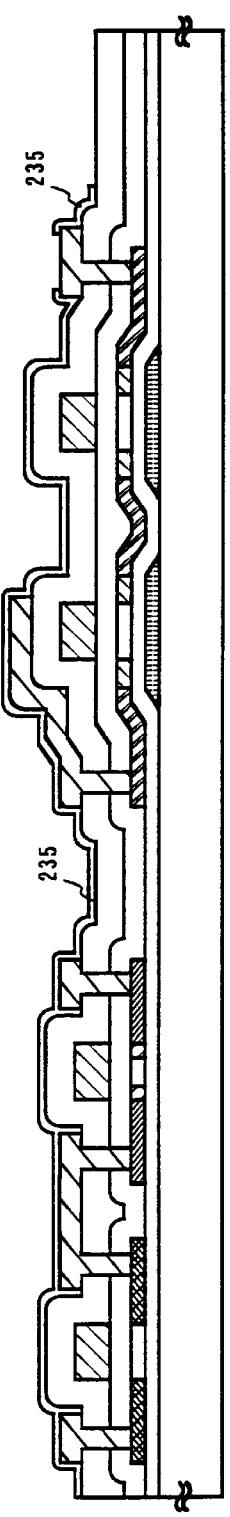
Fig. 5B STEP OF FORMING PROTECTIVE FILM
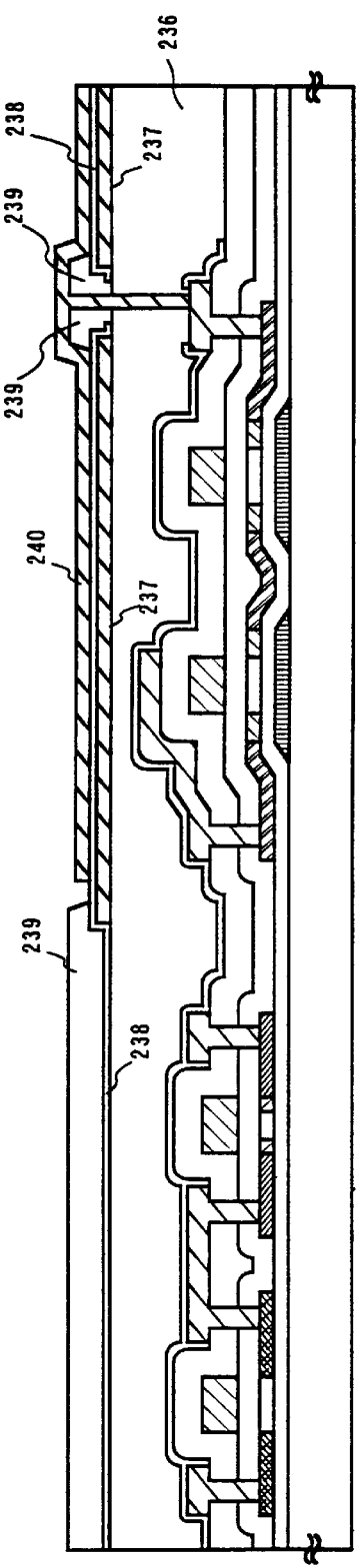
Fig. 5C
DRIVER CIRCUIT     PIXEL SECTION

CIRCUIT DIAGRAM OF EL PANEL

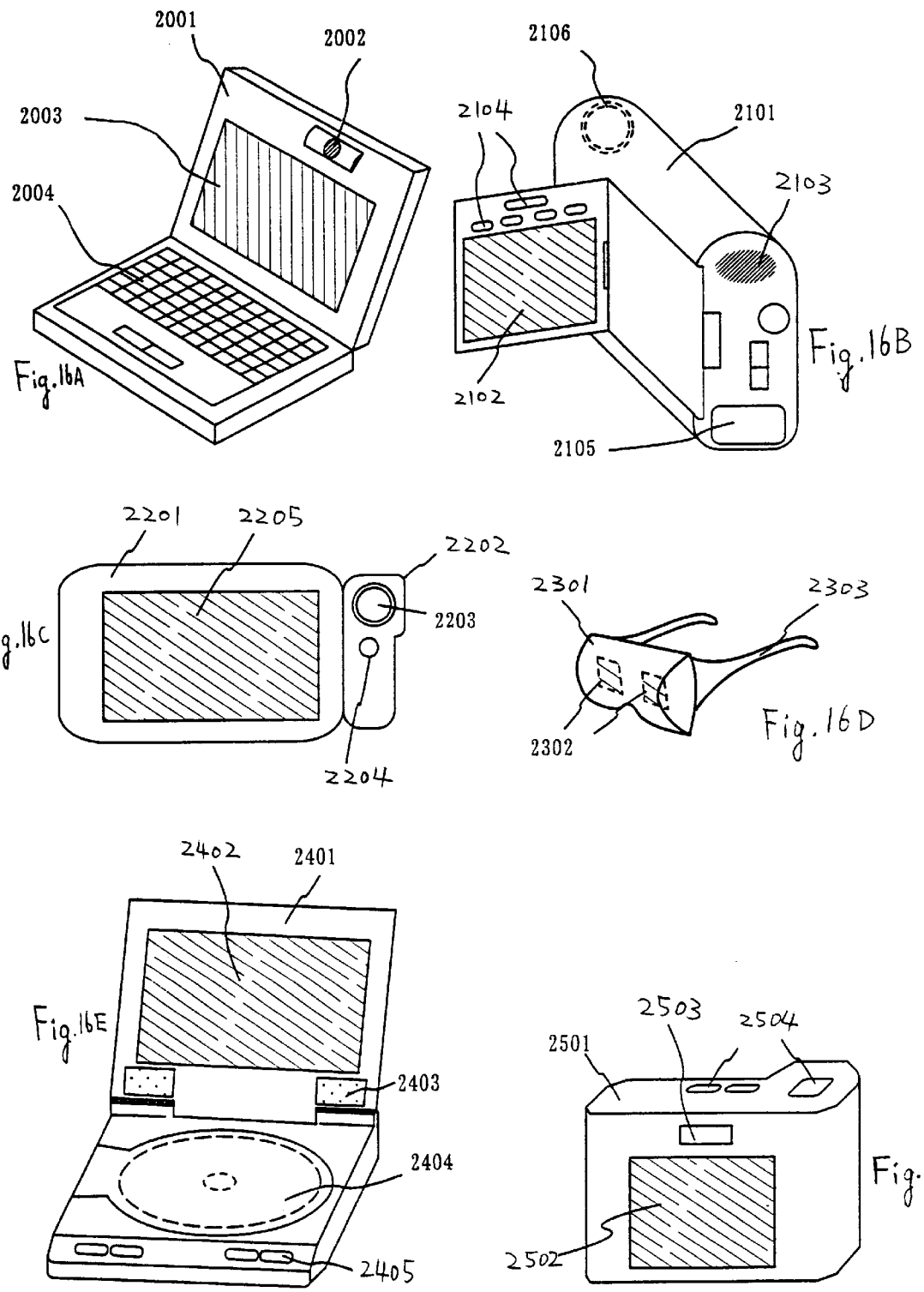

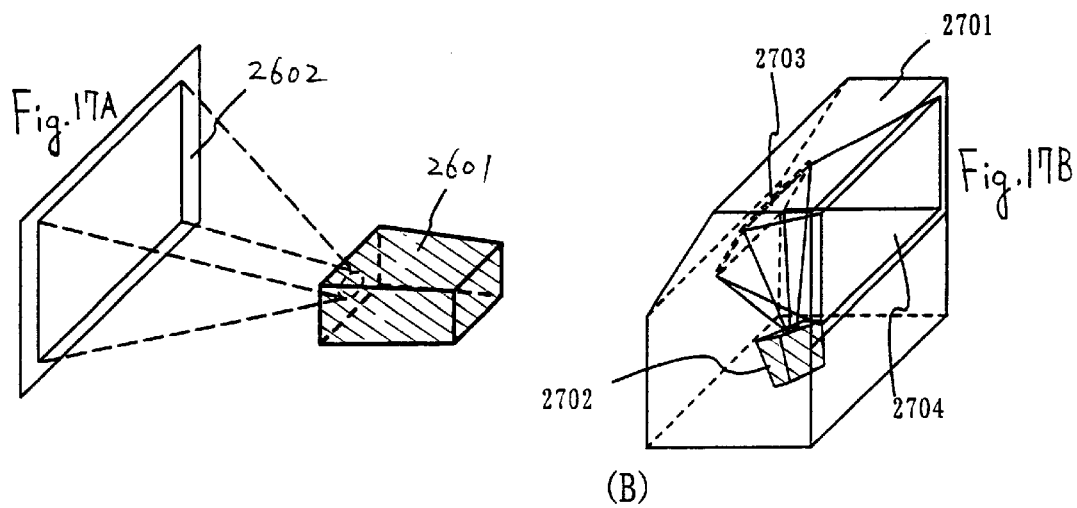
Fig. 17A
Fig. 17B
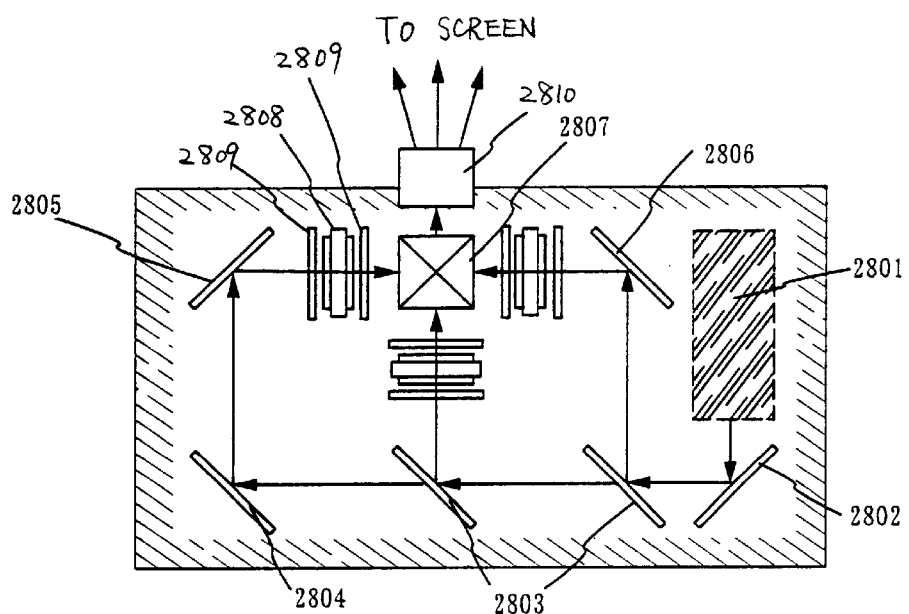
Fig. 17C  PROJECTION DEVICE (THREE PLATE TYPE)
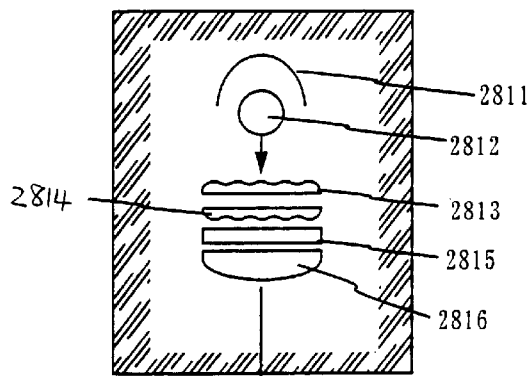
Fig. 17D  LIGHT SOURCE OPTICAL SYSTEM

SEMICONDUCTOR DEVICE HAVING DRIVER CIRCUIT AND PIXEL SECTION PROVIDED OVER SAME SUBSTRATE

BACKGROUND OF THE INVENTION

1. Field of the Invention

The present invention relates to a semiconductor device having a circuit structured by a thin film transistor (hereafter referred to as a TFT). For example, the present invention relates to an electro-optical device, typically a liquid crystal display panel, and to electronic equipment with such electro-optical device installed as a component.

Note that, throughout this specification, semiconductor device indicates general devices which function by using semiconductor characteristics, and that electro-optical devices, semiconductor circuits, and electronic equipment are all categorized as semiconductor devices.

2. Description of the Related Art

Techniques for using semiconductor thin films (with a thickness on the order of several tens nm to several hundreds of nm) formed on a substrate having an insulating surface to structure a thin film transistor (TFT) have been in the spotlight in recent years. Thin film transistors are widely applied to electronic devices such as ICs and electro-optical devices, and their development as switching devices for image display devices is proceeding apace.

For example, the application of TFTs is being tested in all electric circuits in a liquid crystal display device: in a pixel section for controlling each of the pixels arranged in matrix; in a driver circuit for controlling the pixel section (hereafter referred to as a driver circuit); and in addition, in a logic circuit for processing external data signals (such as a processor circuit and a memory circuit).

A structure with these circuits (pixel section, driver circuits) integrated on one substrate is known (a system on panel). The pixels in the pixel region fulfill a role of maintaining information sent from the driver circuit, but unless the off current of the TFTs connected to the pixels is sufficiently low, the information cannot be stored, and a good display cannot be obtained.

In the driver circuit, on the other hand, the TFTs must have a high mobility, and the higher the mobility, the simpler the circuit structure can be made, and the faster the display device can be operated.

The characteristics required for the TFTs placed in the driver circuit and the pixel region differ, as above. Namely, the TFTs placed in the pixel region are not required to have a very high mobility, but that the off current is small and that the of f current value is uniform throughout the pixel region. On the other hand, in the TFTs for the peripherally placed driver circuits, priority on mobility is put over off current, and a high mobility is required.

However, it has been difficult to manufacture a TFT, which favors high mobility, and a low off current TFT on the same substrate without harming the reliability, and with good productivity, by using a conventional method of manufacturing.

In order to realize a system on panel with a driver circuit and a logic circuit built in, as above, a completely new, unconventional constitution is required.

SUMMARY OF THE INVENTION

The present invention answers this demand, and an object of the present invention is to provide an electro-optical device having high reliability, in which each circuit of an electro-optical device, typically AM-LCD, is formed by a TFT with a structure that appropriately responds to the circuit function.

According to a structure of the present invention disclosed in this specification, there is provided a semiconductor device comprising a driver circuit and a pixel section formed on the same substrate, characterized in that the driver circuit and the pixel section each have an n-channel TFT made up of a channel forming region, a pair of high concentration impurity regions, and a low concentration impurity region, and in that the concentration of a periodic table group 15 element contained in at least a portion of the n-channel TFT low concentration impurity region of the driver circuit is higher in comparison with the concentration of a periodic table group 15 element contained in at least a portion of the n-channel TFT low concentration impurity region of the pixel section.

According to another structure of the present invention, there is provided a semiconductor device comprising a driver circuit and a pixel section formed on the same substrate, characterized in that the driver circuit and the pixel section each have an n-channel TFT made up of a channel forming region, a pair of high concentration impurity regions, and a low concentration impurity region, and in that the concentration of a periodic table group 15 element contained in at least a portion of the n-channel TFT high concentration impurity regions of the driver circuit is higher in comparison with the concentration of a periodic table group 15 element contained in at least a portion of the n-channel TFT high concentration impurity regions of the pixel section.

According to another structure of the present invention, there is provided a semiconductor device comprising a driver circuit and a pixel section formed on the same substrate, characterized in that the driver circuit and the pixel section each have an n-channel TFT made up of a channel forming region; a gate insulating film formed in contact with the channel forming region; a gate electrode formed in contact with the gate insulating film; a pair of low concentration impurity regions formed sandwiching the channel forming region; and a high concentration impurity region formed in contact with the low concentration impurity regions, in that at least a portion of the n-channel TFT low concentration impurity region of the driver circuit overlaps the gate electrode through the gate insulating film, and in that at least a portion of the n-channel TFT low concentration impurity region of the pixel section does not overlap the gate electrode.

In the above structure, the semiconductor device is characterized in that the width of the n-channel TFT low concentration impurity region of the driver circuit in the channel length direction differs from the width of the n-channel TFT low concentration impurity region of the pixel section in the channel length direction.

In the above structure, the semiconductor device is characterized in that the pixel section has an n-channel TFT made up from: a shielding layer; an insulating film formed in contact with the shielding layer; a channel forming region formed in contact with the insulating film; a gate insulating film formed in contact with the channel forming region; a gate electrode formed in contact with the gate insulating film; a pair of low concentration impurity regions formed sandwiching the channel forming region; and a high concentration impurity region formed in contact with the low concentration impurity regions.

In the above structure, the semiconductor device is characterized in that the shielding layer overlaps the channel forming region and the low concentration impurity regions through the insulating film.

In the above structure, the semiconductor device is characterized in that the width of the shielding layer in the channel length direction is wider than the width of the gate electrode in the channel length direction.

According to a structure of the present invention for realizing the above structure, there is provided a method of manufacturing a semiconductor device comprising a driver circuit and a pixel section formed on the same substrate, characterized by comprising:

a first step of forming a shielding layer;

a second step of forming an insulating film covering the shielding layer and the substrate;

a third step of forming a semiconductor layer on the insulating film;

a fourth step of performing crystallization of the semiconductor layer;

a fifth step of patterning the crystallized semiconductor layer, and of forming an active layer of the driver circuit and an active layer of the pixel section;

a sixth step of forming a gate insulating film on the active layers;

a seventh step of selectively doping a periodic table group 15 element into the active layer of the driver circuit using a first mask;

an eighth step of forming a wiring on the gate insulating film;

a ninth step of selectively doping a periodic table group 15 element into the active layers of the driver circuit and the pixel section using the wiring as a mask; and a tenth step of selectively doping a periodic table group 15 element into the active layers of the driver circuit and the pixel section using a second mask.

In the above structure, the method of manufacturing a semiconductor device is characterized in that the concentration of the periodic table group 15 element doped in the seventh step 7 is: higher than the concentration of the periodic table group 15 element doped in the ninth step; and lower than the concentration of the periodic table group 15 element doped in the tenth step.

According to another structure of the present invention, there is provided a method of manufacturing a semiconductor device having a driver circuit and a pixel section on the same substrate, characterized by comprising:

a first step of forming a shielding layer;

a second step of forming an insulating film covering the shielding layer and the substrate;

a third step of forming a semiconductor layer on the insulating film;

a fourth step of performing crystallization of the semiconductor layer;

a fifth step of patterning the crystallized semiconductor layer, and of forming an active layer of the driver circuit and an active layer of the pixel section;

a sixth step of forming a gate insulating film on the active layers;

a seventh step of selectively doping a periodic table group 15 element into the active layer of the driver circuit using a first mask;

an eighth step of performing a first process of activating the periodic table group 15 element doped into the active layers;

a ninth step of forming a wiring on the gate insulating film;

a tenth step of selectively doping a periodic table group 15 element into the active layers of the driver circuit and the pixel section using the wiring as a mask;

an eleventh step of selectively doping a periodic table group 15 element into the active layers of the driver circuit and the pixel section using a second mask; and a twelfth step of performing a second process of activating the periodic table group 15 element doped into the active layers.

In the above structure, the method of manufacturing a semiconductor device is characterized in that the shielding layer is formed only in the region which becomes the pixel section.

In the above structure, the method of manufacturing a semiconductor device is characterized in that the second mask is formed by back side exposure.

BRIEF DESCRIPTION OF THE DRAWINGS

In the accompanying drawings:

FIGS. 2A to 2D are diagrams showing the manufacturing process of an AM-LCD;

FIGS. 3A to 3D are diagrams showing the manufacturing process of an AM-LCD;

FIGS. 4A to 4C are diagrams showing the manufacturing process of an AM-LCD;

FIGS. 5A to 5C are diagrams showing the manufacturing process of an AM-LCD;

FIGS. 16A to 16F are diagrams showing examples of electronic equipment;

FIGS. 17A to 17D are diagrams showing examples of electronic equipment; and

DETAILED DESCRIPTION OF THE PREFERRED EMBODIMENTS

Embodiment Mode

Figure 1:
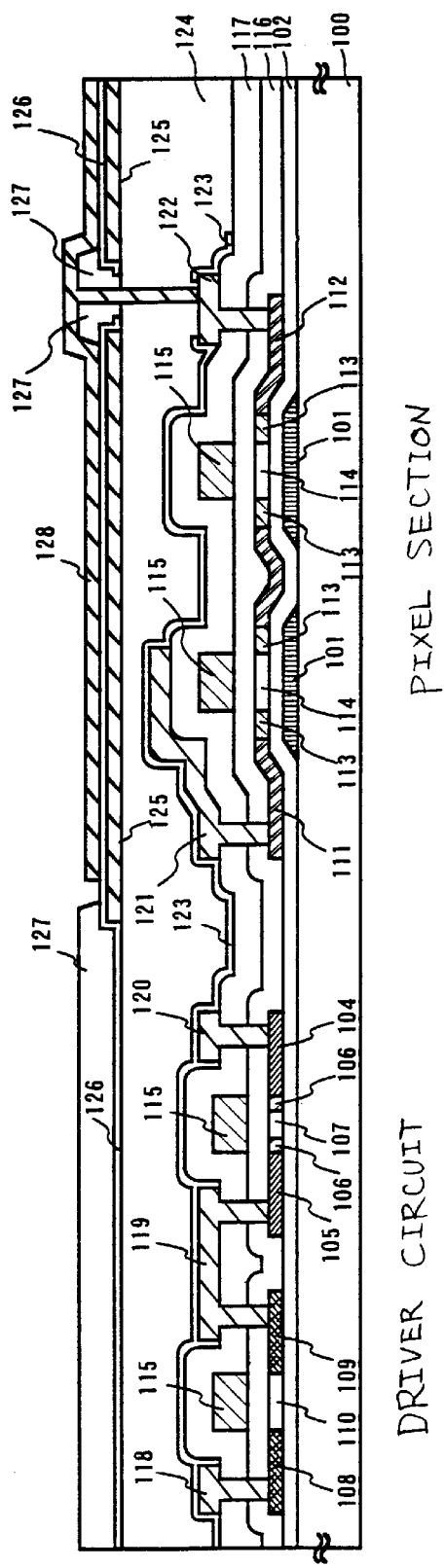
FIG. 1 is a diagram showing the cross sectional structure of an AM-LCD.

An embodiment mode of the present invention is explained below using FIG. 1. FIG. 1 shows a cross sectional diagram of an AM-LCD in which a driver circuit and a pixel section are formed together on the same substrate. Note that a CMOS circuit is shown here as a basic circuit structuring the driver circuit, and that a double gate structure TFT is shown as a pixel TFT. A triple gate structure or a single gate structure may of course be used.

In FIG. 1, reference numeral 100 denotes a substrate having heat resistance. A glass substrate, a quartz substrate, a plastic substrate, a silicon substrate, a ceramic substrate, or a metallic substrate (typically a stainless steel substrate) may be used as the substrate 100. A base film (preferably an insulating film containing silicon as its principal constituent) may be formed if necessary no matter which substrate is used. Note that the use of a substrate having transparency to light is preferable for cases in which back side exposure is used in order to reduce the number of masks.

Reference numeral 101 denotes a shielding layer, and the base film is formed on that. The shielding layer is formed in the pixel section, protecting a channel forming region of the TFT from light and electromagnetic waves. Note that any material having shielding properties (an absorbance of 3 or greater) may be used as the shielding layer material. However, it is preferable to use a material having heat resistant properties which can endure the temperature of later processes.

Reference numeral 102 denotes a silicon oxide film formed as a base film, and a semiconductor layer which becomes an active layer of a driver TFT and an active layer of the pixel TFT is formed on top. A gate insulating film 116 is then formed, covering the active layers, and a gate electrode is formed on the gate insulating film 116. Note that throughout this specification, an "electrode" is a portion of a "wiring," and electrode indicates a point where the portion of a wiring electrically connects to another wiring, or it indicates a point where the portion of a wiring intersects a semiconductor layer. Therefore; for convenience of explanation, while "wiring" and "electrode" are both used properly, the term "wiring" always includes The active layer of the driver TFT in FIG. 1 is formed by a source region 104, a drain region 105, LDD (lightly doped drain) regions 106, and a channel forming region 107, all of an n-channel TFT (hereafter referred to as NTFT); and a source region 108, a drain region 109, and a channel forming region 110, all of a p-channel TFT (hereafter referred to as PTFT). Further, the LDD regions 106 of the driver TFT are formed with a width (in the channel length direction of 0.05 to 0.5 $\mu$m (preferably between 0.1 and 0.3 $\mu$m). In addition, hot carrier resistance is increased in the present invention with a structure (GOLD structure) in which the LDD region 106 of the n-channel TFT of the driver TFT overlaps with a portion of a gate electrode 115.

Furthermore, the active layer of the pixel TFT (an NTFT is used here) is formed by source regions or drain regions 111 and 112, LDD regions 113, and channel forming regions 114. In addition, the width of the LDD regions 113 of the pixel TFT is made to differ from the width of the LDD regions 106 of the driver TFT. Note that the off current is reduced and that the reliability is increased with a structure (LDD structure) in which the LDD regions 113 of the pixel TFT do not overlap the gate electrode 115.

Please also note that a structure having an LDD region to which a gate voltage is applied is referred to as a GOLD structure through this specification. On the other hand, a structure having only an LDD region to which a gate voltage is not applied is referred to as an LDD structure.

Furthermore, the present invention is characterized in that a low concentration impurity region is formed in each circuit TFT by doping an impurity element at a concentration corresponding to the function of each circuit of an electro-optical device, typically AM-LCD, formed on the same substrate.

A periodic table group 15 element is doped into the semiconductor layer of the LDD regions 106 of the n-channel TFT of the driver TFT, and the present invention is characterized in that the concentration of the group 15 element, for example phosphorous, doped into this LDD region ranges between $1\times10^{16}$ and $5\times10^{18}$ atoms/cm$^3$. It is preferable that the phosphorous concentration of the LDD region of the driver TFT be from 2 to 10 times the phosphorous concentration in the LDD region of the pixel TFT. It is possible to realize an ever greater increase in the driver TFT mobility by setting the concentration as above.

On the other hand, the present invention is characterized in that a periodic table group 15 element is doped into the LDD regions 113 of the pixel TFT at a low concentration compared to that of the LDD regions 106 of the n-channel TFT of the driver TFT. It is thus possible to realize an even greater reduction in off current of the pixel TFT.

Furthermore, a single insulating film with the same film thickness is used as the gate insulating film 116 of each TFT here, but there are no particular limitations on this. For example, a structure may be used in which at least two or more types of TFTs exist on the same substrate, the TFTs having different gate insulating films corresponding to the circuit characteristics.

It is possible to use any material having conducting properties as the gate electrode 115 material, and typically a silicon film having conducting properties (such as, for example, a phosphorous doped silicon film, a boron doped silicon film) or a metallic film (such as, for example, a tungsten film, a tantalum film, a molybdenum film, or a titanium film) may be used. A silicide film of a silicification of one of the above metallic films, or a nitrated metallic film (such as a tantalum nitride film, a tungsten nitride film, or a titanium nitride film) may also be used. Further, these films may be freely combined into a laminate film.

Further more, when using the above metallic films as the gate electrode 115 material, a laminate structure with a silicon film in order to prevent oxidation of the metallic film is preferable. In addition, a structure in which the metallic film is covered with a silicon nitride film is effective from an oxidation prevention perspective.

Next, reference numeral 117 denotes a first interlayer insulting film, formed by an insulating film containing silicon (a single layer or a laminate). A silicon oxide film, a silicon nitride film, an oxidized silicon nitride film (in which the amount of nitrogen is greater than the amount of oxygen), and a nitrated silicon oxide film (in which the amount of oxygen is greater than the amount of nitrogen) can be used as the insulating film containing silicon.

Contact holes are then formed in the first interlayer insulating film 117, and source wirings 118 and 120, and a drain wiring 119 of the driver TFT, and source or drain wirings 121 and 122 of the pixel TFT are formed. A passivation film 123 and a second interlayer insulating film 124 are formed on that. A transparent conductive film 125, and an insulating film 126 which becomes a dielectric, are laminated on top in order to form a holding capacitor. Note that the transparent conductive film 125 is either set to a fixed electric potential, or is left in a floating state (an electrically independent state). In addition, a third interlayer insulating film 127 is formed as a leveling film, and a pixel electrode 128 is formed after forming a contact hole.

The holding capacitor is formed here by the transparent conductive film 125, the insulating film 126, and the pixel electrode 128, but no particular limitations are placed on this. For example, a structure in which a capacitance wiring is formed, a structure in which the high concentration impurity region 122 can be extended as the upper electrode, or a structure in which a shielding film is formed on the second interlayer insulating film 124 from a conducting material as the upper electrode can be used as the structure forming the holding capacitor.

Furthermore, a structure may be used in which a shielding film is formed on each TFT using the same material as the gate wiring, and a structure in which a shielding film is formed on an opposing substrate may also be used.

It is preferable to use a resin film with a small specific dielectric constant as the second interlayer insulating film 124 and as the third interlayer insulating film 127. A film such as a polyimide film, an acrylic film, a polyamide film, or a BCB (benzocyclobutene) film can be used as the resin film.

Further, it is preferable to use an insulating film containing silicon as its principal constituent, or an oxide film of the shielding film, as the insulating film. A known technique such as sputtering, high pressure oxidation, or anodic oxidation may be used when forming the insulating film 126.

Still further, a transparent conductive film, typically ITO, may be used when manufacturing a transmission type AM-LCD, and a metallic film with a high reflectivity, typically aluminum, may be used when manufacturing a reflecting type AM-LCD, as the pixel electrode 128.

Note that the pixel electrode 128 is electrically connected to the drain region 112 of the pixel TFT through the drain electrode 122 in FIG. 1, but a structure in which the pixel electrode 128 and the drain region 112 are directly connected may also be used.

In addition, an example is shown here in which the shielding layer is formed only in the pixel section, but among the driver circuits, it is preferable to use a TFT with a small off current for the sampling circuit, and therefore it is also preferable to form the shielding layer when forming that circuit TFT.

The AM-LCD with the above structure is characterized by having a driver circuit provided with a high mobility GOLD structure NTFT, and a pixel section provided with a low off current LDD structure NTFT. By doing so, it is possible to realize an electro-optical device having high driving performance and high reliability, in which TFTs which place priority on mobility, and TFTs with low off current, are formed on the same substrate and applied to circuits, corresponding to circuit function.

A more detailed explanation of the present invention with the above structure is given by the embodiments shown below.

Embodiment 1

An explanation of a manufacturing process for realizing the structure of FIG. 1, explained by the "embodiment mode" of the present invention, is given in Embodiment 1. FIGS. 2A to 5C are used in the explanation.

First, a quartz substrate 200 having light transmitting properties is prepared as a substrate, and after forming a layer from a material having shielding characteristics on top, a shielding layer 201 and an alignment mark (not shown in the figures) are formed at the same time by patterning. The shielding layer is formed in the pixel section, and is very important for determining the width of an LDD region in the pixel section formed in a later process of back side exposure.

A metallic film (such as, for example, a tungsten film, a tantalum film, a molybdenum film, or a titanium film), or a silicide film of the above metallic films, a nitrated metallic film (such as a tantalum nitride film, a tungsten nitride film, or a titanium nitride film) is used as the shielding film 201. Further, these films may be freely combined into a laminate film. Note that it is preferable to make the shielding layer into a tapered shape in order to prevent poor coverage due to a step difference.

A 200 nm thick silicon oxide film (also referred to as a base film) 201 and a 50 nm thick amorphous silicon film 203a are then formed in succession without exposure to the atmosphere. (See FIG. 2A.) By doing so, the bottom surface of the amorphous silicon film 203a can be prevented from adsorbing impurities such as boron which are contained in the atmosphere.

Note that although an amorphous silicon film is used in Embodiment 1, other semiconductor films may also be used. A microcrystalline silicon film may be used, as may an amorphous silicon germanium film. Further, methods such as PCVD, LPCVD, or sputtering can be used as the means of forming the base film and the semiconductor film.

Crystallization of the amorphous silicon film is performed next. Any known crystallization technique, such as thermal crystallization, crystallization by infrared light or by ultraviolet light, thermal crystallization using a catalytic element, or laser crystallization using a catalytic element may be used in the present invention. The technique recorded in Japanese Patent Application Laid-open No. Hei 9-312260 is used as the means of crystallization in Embodiment 1. In this technique, an element chosen from among nickel, cobalt, palladium, germanium, platinum, iron, and copper is used as a catalytic element to promote crystallization of the silicon film.

First, a silicon oxide film is formed on the amorphous silicon film, and this is patterned, forming a mask 204 which has an opening. It is preferable to form the amorphous silicon film 203a and the silicon oxide film, which becomes a mask, in succession without exposure to the atmosphere. A layer containing nickel is formed on the exposed amorphous silicon film, and after a dehydrogenation process, crystallization is performed by heat treatment at between 500 and 650° C. for 4 to 16 hours. The portions of the amorphous silicon film in contact with nickel crystallize first by this crystallization process, and crystallization then proceeds in a horizontal direction (in the direction of the arrows of FIG. 2B). In embodiment 1, dehydrogenation is performed at 450° C. for 1 hour after applying a nickel acetate solution containing 10 ppm nickel by weight, and then crystallization is performed by heat treatment at 600° C. for 12 hours, forming a crystalline silicon film 203b. (See FIG. 2B.)

Note that by forming the mask 204 from a silicon oxide film, the active layer is prevented from being contaminated by organic matter. A periodic table group 15 element (phosphorous is used in Embodiment 1) doping process is performed next using the mask 204 as is. It is preferable that the concentration of doped phosphorous be between $5\times10^{18}$ and $1\times10^{20}$ atoms/cm$^3$ (desirably from $1\times10^{19}$ and $5\times10^{19}$ atoms/cm$^3$). However, the required concentration of doped phosphorous changes in accordance with the temperature and time of a later gettering process, and area of the phosphorous doped region, and therefore the concentration is not limited to be within this concentration range. A region doped with phosphorous (hereafter referred to as phosphorous doped region) 203c is thus formed. (See FIG. 2C.)

Heat treatment at between 500 and 650° C. for 2 to 16 hours then follows, performing gettering of the catalytic element (nickel in Embodiment 1) used to crystallize the silicon film. A temperature on the order of ±50° C. from the maximum temperature in the thermal hysteresis is necessary in order to produce a gettering effect. Heat treatment for crystallization is performed at between 550 and 600° C., and therefore a sufficient gettering effect can be produced by heat treatment at between 500 and 650° C. Nickel moves in the direction of the arrows in FIG. 2D by heat treatment at 600° C. for 8 hours in Embodiment 1, and is then captured by the phosphorous contained in the phosphorous doped region 203c due to the gettering. Thus a gettering region (a region corresponding to the phosphorous doped region 203b) is formed. The concentration of nickel contained in a region denoted by reference numeral 203d is thus reduced to $2 \times 10^{17}$ atoms/cm$^3$ or less (preferably to $1 \times 10^{16}$ atoms/cm$^3$ or less). The gettering region is further removed by later patterning.

The crystalline silicon (polysilicon) film is then patterned after removing the mask 204, forming semiconductor layers 205a and 205b of the driver TFT, and a semiconductor layer 206 of the pixel TFT. (See FIG. 3A.)

Note that an impurity element (phosphorous or boron) may be doped into the crystalline silicon film before or after the formation of the semiconductor layers of the driver TFT and the pixel TFT, in order to control the TFT threshold voltage. This process may be performed on the NTFT or the PTFT, or it may be performed on both.

A gate insulating film 207 is formed next by plasma CVD or by sputtering. The gate insulating film 207 is an insulating film that functions as the TFT gate insulating film, and is given a film thickness of 50 to 200 nm. A 70 nm thick silicon oxide film is used in Embodiment 1. Further, in addition to the silicon oxide film, a laminate structure of a silicon nitride film formed on the silicon oxide film can be used, and a nitrated silicon oxide film, in which nitrogen is doped into the silicon oxide film, may also be used.

Once the gate insulating film 207 is formed, resist masks 208a to 208c are formed on a channel forming region 210 of the driver circuit NTFT and on the PTFTs of the pixel section and the driver circuit. A periodic table group 15 element (phosphorous in Embodiment 1) is next doped, forming a low concentration impurity region 209 of the NTFT of the driver TFT. (See FIG. 3B.) The concentration of phosphorous doped into the low concentration impurity region 209 is regulated to be between $5 \times 10^{17}$ and $5 \times 10^{18}$ atoms/cm$^3$. The phosphorous concentration at this point determines the concentration in the LDD region of the driver circuit NTFT.

An ion implantation method which performs separation of mass may be used for the phosphorous doping process, and a plasma doping method, in which separation of mass is not performed, may also be used. Further, conditions such as the acceleration voltage and dose amount may be set to optimal values by the operator. In Embodiment 1 phosphine gas diluted to between 1 and 10% by hydrogen is used as the doping gas, the dose is set to $4 \times 10^{13}$ atoms/cm$^3$, and the acceleration voltage is set to 80 kV.

The resist masks 208a to 208c are next removed, and activation of the impurities is performed. Heat treatment in an inert atmosphere or in an oxygen atmosphere in the range of 300 and 700° C. for approximately 2 hours is sufficient for the activation process, but by performing heat treatment at between 700 and 1150° C. for 2 hours, at 800° C. in Embodiment 1, improvements in crystallinity will occur at the same time as sufficient activation. If this process is carried out in the atmosphere or in an oxygen atmosphere, then thermal oxidation will occur at the same time as activation. Note that activation is divided and performed in two stages in Embodiment 1, but if the material used for a later formed gate electrode is one which can withstand the activation temperature, then the number of process steps can be reduced by a single activation step.

After thus completing the activation process, a conductive film 211 is formed next. (See FIG. 3C.) Patterning is then performed, forming a gate wiring 212a of the driver TFT (NTFT side), and a gate wiring 212c of the pixel TFT. Note that two wirings are shown for the gate wiring 212c due to the double gate structure pixel TFT, but the two are actually the same wiring. In addition, a conductive layer 212a is formed, covering the entire PTFT of the driver TFT.

A laminate film of a tantalum nitride film, a tantalum film, and a tantalum nitride film, (or a tantalum nitride film and a tantalum film), in order from the base layer, is used as the wirings 212a to 212c in Embodiment 1. Of course it is possible to use the other conducting materials which were explained in the embodiment mode of the present invention. The film thickness of the gate wiring in Embodiment 1 is set to 300 nm.

A periodic table group 15 element is then doped with the wirings 212a to 212c as a mask, and a low concentration impurity region 214 is formed in a self aligning manner. (See FIG. 3D.) The concentration of the impurity doped into the low concentration impurity region 214, phosphorous here, is regulated to be between $5 \times 10^{17}$ and $5 \times 10^{18}$ atoms/cm$^3$. However, a dose amount of between $5 \times 10^{12}$ and $1 \times 10^{13}$ atoms/cm$^3$ is doped here, lower than that of the previous phosphorous doping process. The concentration of the periodic table group 15 element doped at this time determines the concentration of the LDD region of the pixel section.

Similar to the process shown in FIG. 3B, the phosphorous doping process may be carried out by an ion implantation method which performs separation of mass, or by a plasma doping process, in which separation of mass is not performed. Furthermore, optimal values for conditions such as acceleration voltage and dose amount may be set by the operator.

A resist mask is then formed by back side exposure. (See FIG. 4A.) The shielding film 201 becomes a mask at this point in the pixel section, forming resist masks 217c and 217d. On the other hand, in the NTFT of the driver TFT the gate electrode becomes a mask, forming a resist mask 217b. In addition, the conductive layer becomes a mask in the PTFT, forming a resist mask 217a.

Furthermore, although back side exposure is used in Embodiment 1 to perform the formation of the resist masks 217a to 217d, there are no special limitations on this, and a resist mask using a photo mask may also be used.

High concentration doping of an impurity is then performed using the resist masks 217a to 217c thus obtained by back side exposure as a mask. (See FIG. 4B.) The concentration of doped phosphorous in impurity regions 219 to 223 is regulated to be between $5 \times 10^{19}$ and $1 \times 10^{21}$ atoms/cm$^3$.

A source region 218, an LDD region 225, and a channel forming region 226 of the NTFT forming the CMOS circuit are demarcated by this process. In addition, a source region 227, a drain region 228, LDD regions 229a and 229b, and channel forming regions 230a and 230b of the pixel TFT are demarcated.

The impurity regions are thus formed through three divided stages of doping with the periodic table group 15 element (phosphorous in Embodiment 1).

Resist masks 224a and 224b are formed next, and patterning is performed, forming a gate electrode 225 of the PTFT. The resist mask 224b covers everything except for the region which becomes the PTFT of the CMOS circuit. Doping of a periodic table group 13 element (boron in Embodiment 1) is then performed with the resist masks used as is, forming the source region 227 and the drain region 228. (See FIG. 4C.) Specifically, the doping process is regulated so that a boron concentration of $1 \times 10^{20}$ to $3 \times 10^{21}$ atoms/cm$^3$ is doped. Diborane diluted to between 1 and 10% by hydrogen is used in Embodiment 1.

The source region 227, the drain region 228, and the channel forming region 226 of the PTFT forming the CMOS circuit are thus demarcated.

The boron doping process may, of course, be carried out by an ion implantation method which performs separation of mass, or by a plasma doping process, in which separation of mass is not performed. Furthermore, optimal values for conditions such as acceleration voltage and dose amount may be set by the operator.

After thus completing formation of all of the impurity regions, the resist masks 224a and 224b are removed. Activation of the impurities is then performed by a process such as laser annealing, thermal annealing, furnace annealing, or lamp annealing. Laser annealing is performed here in the atmosphere using an excimer laser with an energy density of 187 mJ/cm$^2$. Furthermore, if the activation is performed by thermal annealing, then a reduction in the catalytic element by a gettering effect of phosphorous used in doping can be achieved in the channel forming region at the same time as activation. However, in order to produce the gettering effect, it is necessary for the temperature to be within the range of ±50° C. of the maximum temperature in the thermal hysteresis.

A first interlayer insulating film 229 is then formed. A 1 μm thick silicon oxide film is formed by plasma CVD in Embodiment 1. After forming contact holes, source wirings 230, 232, and 233, and drain wirings 231 and 234 are then formed. These wirings are formed by a laminate film of a conductive film having aluminum as its principal constituent sandwiched by titanium films. (See FIG. 5A.)

The drain wiring 231 is used at this time as a common wiring in the NTFT and in the PTFT which form the CMOS circuit.

A passivation film 235 is formed next. A silicon nitride film, an oxidized silicon nitride film, a nitrated silicon oxide film, or a laminate film of these insulating films and a silicon oxide film can be used as the passivation film 235. A 300 nm thick silicon nitride film is used in Embodiment 1 as the passivation film.

Note that it is effective to perform plasma processing using a gas containing hydrogen (ammonia gas in Embodiment 1) as a pre-process before forming the silicon nitride film in Embodiment 1. Hydrogen activated (excited) by the plasma is locked into the active layers (semiconductor layers) in this preprocess, therefore effectively performing hydrogen termination.

In addition, if nitrous oxide gas is added to the gas containing hydrogen, then the surface of the piece to be processed is cleaned by the water which develops, and in particular, contamination by boron, etc., contained in the atmosphere can effectively be prevented.

After formation of the passivation film 235, the passivation film in the pixel display region is selectively removed in Embodiment 1 in order to raise the aperture ratio. A second interlayer insulating film 236 is then formed on top from a 1 μm acrylic film. A conductive film 237 is then formed on top, from an ITO film in Embodiment 1, and patterning is performed, forming a lower electrode of a holding capacitor. An insulating film 238 is formed from a silicon oxide film, which becomes a dielectric, by sputtering on top. Note that the conductive film 237 is either set to a fixed electric potential, or is left in a floating state (an electrically independent state).

Next, sputtering is performed to form a third interlayer insulating film 239 from another 1 μm thick acrylic film. The acrylic film is selectively removed in the region which forms the holding capacitor, and a contact hole is formed at the same time. A pixel electrode 240 is then formed by an ITO film. The holding capacitor is formed by the conductive film 237, the insulating film 238, and the pixel electrode 240. Note that a thin organic resin film may be formed for protection because the insulating film 238 is thin. Thus an AM-LCD with the structure shown in FIG. 5C is completed.

The present invention is thus characterized by performing the doping of an impurity at least 3 times with differing dose amounts, forming NTFT structures and impurity concentrations of LDD regions which are suitable for the function of each circuit, by formation of a driver circuit provided with at least one NTFT with a high mobility GOLD structure, and by formation of a pixel section provided with an NTFT with a low off current LDD structure.

Figure 6:
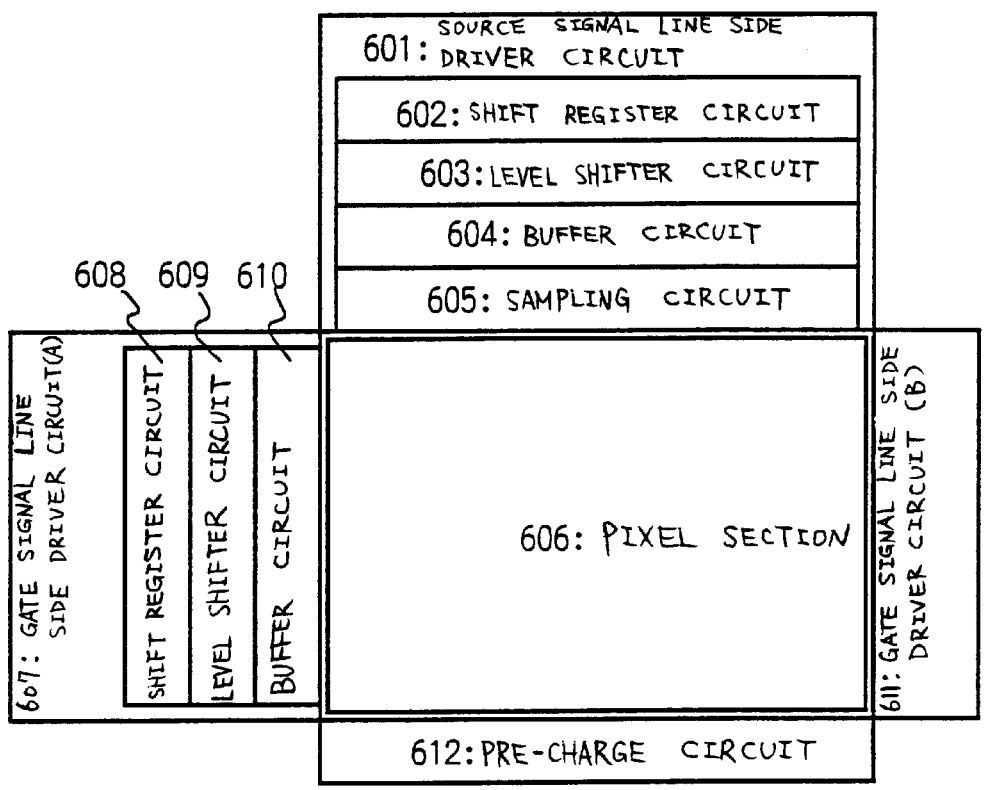
FIG. 6 is a diagram showing the circuit arrangement of an AM-LCD.

FIG. 6 shows an example of the circuit structure of an AM-LCD. The AM-LCD of Embodiment 1 has a source signal line side driver circuit 601, a gate signal line side driver circuit (A) 607, a gate signal line side driver circuit (B) 611, a pre-charge circuit 612, and a pixel section 606.

The source signal line side driver circuit 601 is provided with a shift register circuit 602, a level shifter circuit 603, a buffer circuit 604, and a sampling circuit 605.

Furthermore, the gate signal line side driver circuit (A) 607 is provided with a shift register circuit 608, a level shifter circuit 609, and a buffer circuit 610. The gate signal line side driver circuit (B) 611 has the same structure.

Specifically, the NTFTs of the shift register circuits 602 and 608, which place precedence on high mobility, are given the GOLD structure of the present invention, while the NTFTs of the level shifter circuits 603 and 609, the buffer circuits 604 and 610, the sampling circuit 605, and the pixel section 606 are given the LDD structure of the present invention. Thus it is preferable to use a GOLD structure or an LDD structure in correspondence to each circuit of the driver circuits. Further, a structure in which a shielding layer is formed above or below the driver circuits may also be used, and in particular is effective in obtaining stable TFT characteristics in the sampling circuit.

By using the structure of Embodiment 1, a TFT which places precedence on mobility and a TFT with a small off current are formed on the same substrate and applied to circuits corresponding to circuit function, and an electro-optical device having high driving performance and high reliability can be realized.

Further, an example is shown here using a top gate type TFT, but the present invention can be applied regardless of the TFT structure. For example, it is possible to apply the present invention to a reverse stagger type TFT.

In addition, the final active layer (semiconductor layer) of a TFT formed in accordance with the manufacturing processes of Embodiment 1 is formed by a crystalline silicon film having a unique crystal structure which possesses continuity in the crystal lattice. The characteristics of such are explained below.

Looking microscopically at the crystalline silicon film of the active layer formed in accordance with the above manufacturing processes, one finds a crystal structure consisting of multiple needle shape or cylindrical shape crystals. It is easy to confirm this by observation using a TEM (transmission electron microscope).

Further, it has been verified by using electron diffraction and x-ray diffraction that although there is some crystal axis deviation on the surface of the active layer (the channel forming portion), the principal orientation face is {110}. As a result of detailed observation of electron beam diffraction photographs with a spot diameter of 1.5 μm, the applicant of the present invention found that the diffraction spot appeared cleanly in correspondence to the {110} face, and that each spot had a concentric distribution.

Furthermore, the applicant of the present invention observed the grain boundaries formed by each of the contacting cylindrical-shape crystals using an HR-TEM (high resolution transmission electron microscope) and verified that the crystal lattice in the grain boundaries has continuity. This was easily verified by the continuous connection of the observed lattice stripes in the grain boundaries.

Note that the continuity of the lattice in the grain boundaries originates in the fact that the grain boundaries are "planar grain boundaries". The definition of planar grain boundaries in this specification is in "Characterization of High-Efficiency Cast-Si Solar Cell Wafers by MBIC Measurement", Ryuichi Shimokawa and Yutaka Hayashi, Japanese Journal of Applied Physics vol. 27, no. 5, pp. 751–758, 1988, which describes "planar boundary".

According to the above paper, planar grain boundaries includes twin crystal grain boundaries, special stacking faults, special twist grain boundaries, etc. This planar grain boundary possesses a characteristic in that it is not active electrically. Namely, the planar grain boundaries can essentially be seen as non-existent because, unlike other grain boundaries, they do not function as a trap that obstructs the movement of a carrier.

Particularly for cases in which the crystal axis (the axis perpendicular to the crystal face) is the <110> axis, {211} twin crystal grain boundaries can be called grain boundaries corresponding to Σ3. The Σ value is a parameter that indicates the degree of matching in corresponding grain boundaries, and it is known that smaller Σ values signify good grain boundary matching.

Using a TEM, the applicant of the present invention observed in detail a crystalline silicon film obtained by implementing the present invention, and determined that most of the crystal grain boundaries (more than 90%, typically more than 95%) had grain boundaries corresponding to Σ3, i.e. {211} twin grain boundaries.

For the case of two crystals forming a grain boundary and having a {110} face orientation, it is known that, assuming the lattice stripes corresponding to the {111} face in the grain boundary formed between both crystals form an angle θ, then when θ=70.5° the grain boundary corresponds to Σ3.

Neighboring grain lattice stripes in the grain boundaries of the crystalline silicon film used in Embodiment 1 are continuous at just about 70.5°. From this one can arrive at the conclusion that the grain boundaries are {211} twin grain boundaries.

Note that when θ=38.9°, the grain boundary corresponds to Σ9, and that other grain boundaries like this also exist.

The grain boundary as above correspondence is only formed between grains in the same face orientation. In other words, the crystalline silicon film obtained in Embodiment 1 has grains almost all of which has a face orientation roughly matched to {110}, and therefore this grain boundary correspondence is formed over a wide area.

Such crystal structure (grain boundary structure, to be precise) shows that two different grains are joined together with very good matching in the grain boundaries. Namely, a crystal structure in which the crystal lattice has continuity in the grain boundaries, and in which a trap level caused by crystal defects, etc is hardly formed. Therefore it is possible to regard semiconductor thin films having such crystal structure as ones in which grain boundaries do not exist.

Furthermore, it has been verified through TEM observation that defects within the grain boundaries almost completely disappear with a heat treatment process at a high temperature of 700 to 1150° C. It is also evident from the fact that there is a large decrease in the number of defects around the heat treatment process.

The difference in the number of defects appears as the difference in spin density by electron spin resonance (ESR). At present, crystalline silicon films manufactured by the processes in Embodiment 1 have been shown to have a spin density of at most $5\times10^{17}$ spins/cm$^3$ or less (preferably $3\times10^{17}$ spins/cm$^3$ or less). However, this measurement value is near the detection limits of the present measuring equipment, and it is expected that the real spin density is even lower.

From the above, it can be considered that the crystalline silicon film obtained by implementing Embodiment 1 is a monocrystal silicon film or an essentially monocrystal silicon film because grains and grain boundaries essentially do not exist.

Knowledge Related to TFT Electrical Characteristics

The TFT manufactured in Embodiment 1 displays electrical characteristics equivalent to a MOSFET. Data showing the following was obtained from a TFT (in which the active layer is 30 nm in thickness, and the gate insulating film, 100 nm) test manufactured by the applicant of the present invention:

1. The subthreshold coefficient, which is an index of the switching performance (the quickness of on/off switching), is small at between 60 and 100 mV/decade (typically from 60 to 85 mV/decade) for both an n-channel TFT and a p-channel TFT.

2. The electric field effect mobility ($\mu_{FE}$), which is an index of the TFT operation speed, is large at between 200 and 650 cm$^2$/Vs (typically between 300 and 500 cm$^2$/Vs) for an n-channel TFT, and between 100 and 300 cm$^2$/Vs (typically between 150 and 200 cm$^2$/Vs) for a p-channel TFT.

3. The threshold voltage ($V_{th}$), which is an index of the driving voltage for the TFT, is small at between -0.5 and 1.5 V for an n-channel TFT, and between -1.5 and 0.5 V for a p-channel TFT.

The above verifies that it is possible to realize very superior switching characteristics and high speed operation.

Knowledge Related to Circuit Characteristics

The frequency characteristics of a ring oscillator manufactured using a TFT formed by Embodiment 1 are shown next. A ring oscillator is a circuit in which CMOS structure inverter circuits are connected in a ring state with an odd number of layers, and is used to obtain a delay time in each of the inverter circuit layers. The composition of the oscillator used for the experiment was as follows:

Number of layers: 9

TFT gate insulating film thickness: 30 nm and 50 nm

TFT gate length (channel length): 0.6 µm.

The oscillation frequency was investigated using the ring oscillator, and the possible largest oscillation frequency was approximately 1 GHz. Further, a shift register that is one of TEGs of an LSI circuit was actually manufactured and its operating frequency was verified. As a result, a 100 MHZ output pulse operating frequency was obtainable in the shift register circuit with a gate insulating film thickness of 30 nm, a gate length of 0.6 µm, a supply voltage of 5 V, and 50 layers.

The amazing data above for the ring oscillator and the shift register shows that the TFT of Embodiment 1 has a performance (electrical characteristics) equivalent to, or surpassing, a MOSFET.

Embodiment 2

Figure 7A:
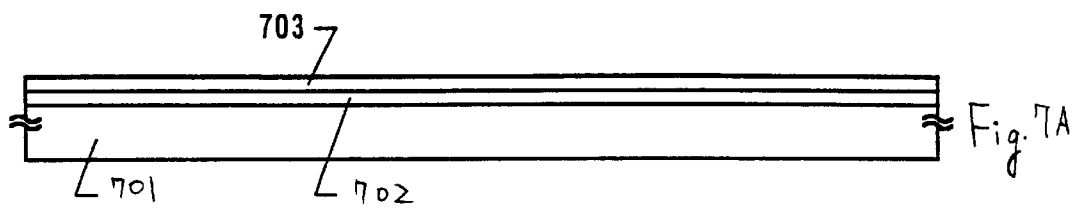
FIGS. 7A and 7B are diagrams showing the manufacturing process of an AM-LCD.
Figure 7B:
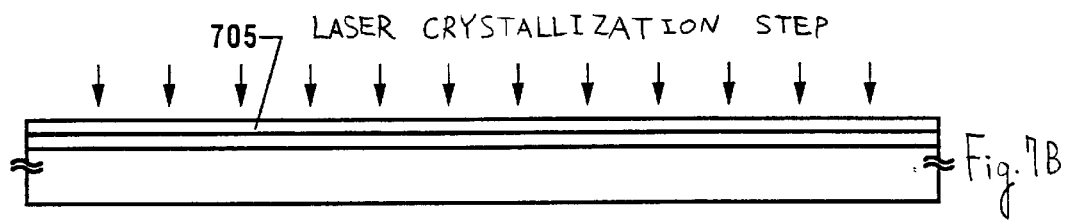

The case of using another means to form the crystalline silicon film of Embodiment 1 is explained in Embodiment 2 by using FIGS. 7A and 7B.

Specifically, a process of crystallization by irradiation of infrared light or ultraviolet light (hereafter referred to as laser crystallization) is used. Laser crystallization is effective because the stress imparted to the substrate is small, and processing can be done in a short time. A pulse laser using a gas such as XeCl, ArF, or KrF as a laser gas, or a continuous oscillation laser such as an Ar laser or a continuous light emission laser is used and irradiated. Note that the laser crystallization conditions (such as laser beam shape, laser light wavelength, overlap ration, irradiation strength, pulse width, repetition frequency, and irradiation time) may be suitably determined by the operator by considering the film thickness of the semiconductor film, the substrate temperature, etc.

First, a silicon oxide film 702 is formed on a substrate 701, and an amorphous silicon film 703 is formed on top. (See FIG. 7A.) After a dehydrogenation process at 500° C. for 1 hour, laser crystallization is performed, forming a crystalline silicon film 705. (See FIG. 7B.)

The point of difference between Embodiment 2 and Embodiment 1 is that laser crystallization is performed without using a catalytic element.

If subsequent processes are performed in accordance with Embodiment 1, then the TFT structure of the present invention can be obtained. However, a catalytic element reduction process (gettering) is performed in Embodiment 1, but is not particularly necessary in Embodiment 2.

Embodiment 3

Figure 8A:
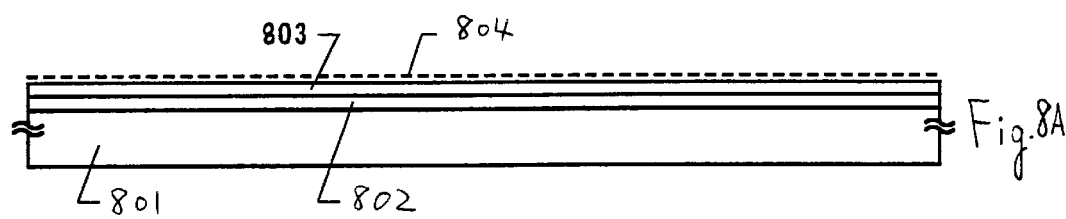
FIGS. 8A and 8B are diagrams showing the manufacturing process of an AM-LCD.
Figure 8B:
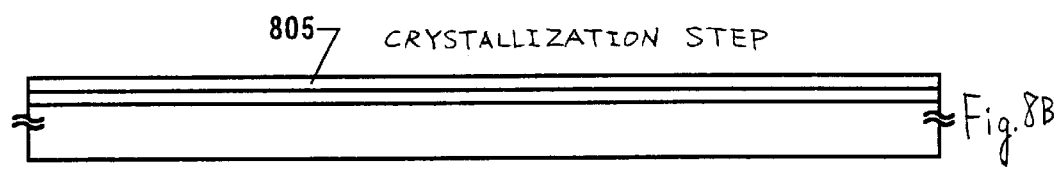

The case of using another means to form the crystalline silicon film of Embodiment 1 is explained in embodiment 3 by using FIGS. 8A and 8B. Note that for simplicity, only the driver circuit region is shown: the shielding layer of the pixel section is not shown in the figures.

Specifically, the technique recorded in Japanese Patent Application Laid-open No. Hei 7-130652 (corresponding to U.S. Pat. Ser. No. 08/329,644) is used to crystallize an amorphous silicon film. The technique is one of maintaining a catalytic element for promoting crystallization (typically nickel) in the surface of the amorphous silicon film, and then performing crystallization.

First, a silicon oxide film 802 is formed on a substrate 801, and then an amorphous silicon film 803 is formed on top. In addition, a nickel acetate solution containing 10 ppm by weight nickel is applied, forming a nickel containing layer 804. (See FIG. 8A.)

After next performing dehydrogenation at 500° C. for 1 hour, heat treatment is performed at between 500 and 650° C. for 4 to 12 hours, forming a crystalline silicon film 805. (See FIG. 8B.) The crystalline silicon film 805 thus obtained has extremely superior crystallinity. Subsequent processes may be performed in accordance with those of Embodiment 1 in order to obtain the TFT structure of the present invention.

Note that it is possible to freely combine the constitution of embodiment 3 with the constitution of Embodiment 1 or Embodiment 2.

Embodiment 4

Figure 9A:
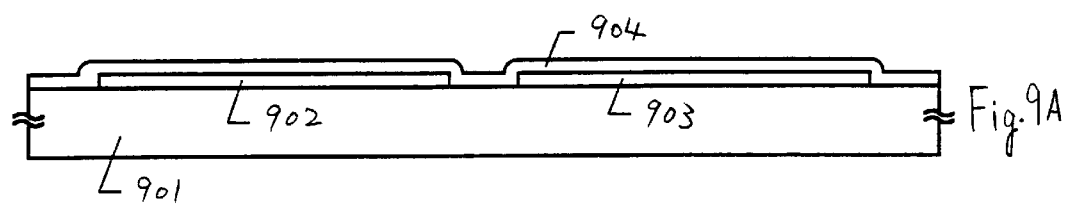
FIGS. 9A and 9B are diagrams showing the manufacturing process of an AM-LCD.
Figure 9B:
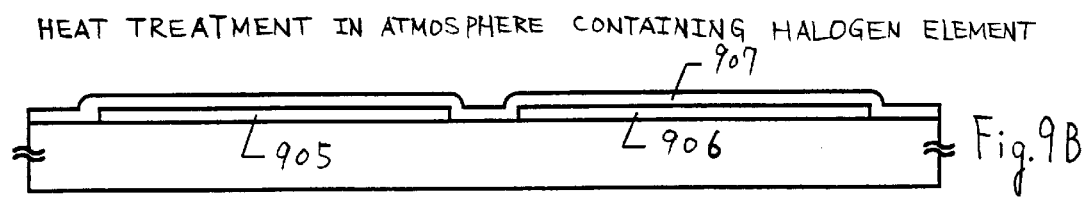

The case of using another means to form the crystalline silicon film and the gate insulating film of Embodiment 1 is explained in embodiment 4 by using FIGS. 9A and 9B. Note that for simplicity, only the driver circuit region is shown: the shielding layer of the pixel section is not shown in the figures.

A substrate which possesses heat resistance of at least the order of 700 to 1100° C. is necessary here, and a quartz substrate 901 is used. The technique shown in Embodiment 1 or Embodiment 3 is then used, forming a crystalline semiconductor film. This is patterned into island shapes for TFT active layers, forming semiconductor layers 902 and 903. A gate insulating film 904 is formed from a film having silicon oxide as its principal constituent, covering the semiconductor layers 902 and 903. A 70 nm thick nitrated silicon oxide film is formed by plasma CVD in Embodiment 4. (See FIG. 9A.)

The heat treatment is then performed in an atmosphere containing a halogen (typically chlorine) and oxygen. Heat treatment is done for 30 minutes at 950° C. in Embodiment 4. Note that the process temperature may be selected in the range of 700 to 1100° C., and the process time may be chosen from 10 minutes to 8 hours.

As a result, under the conditions set in this embodiment, a thermal oxidation film is formed in the interface between the semiconductor layers 905 and 906, and the gate insulating film 904, forming a gate insulating film 907. (See FIG. 9B.) Further, the impurity contained in the gate insulating film 904 and in the semiconductor layers 902 and 903, especially a metallic impurity element, forms a compound with the halogen and can be removed in the gas phase in this oxidation process in the halogen atmosphere.

The gate insulating film 907 manufactured by the above processes has a high withstand voltage and the interface between the semiconductor layers 905 and 906 and the gate insulating film 907 is extremely good. Subsequent processes may be performed in accordance with those of Embodiment 1 in order to obtain the TFT structure of the present invention.

Note that it is possible to freely combine the constitution of Embodiment 4 with the constitution of any of embodiments 1 to 3.

Embodiment 5

The case of using another means to reduce the catalytic element within the crystalline silicon film in Embodiment 1 is explained in Embodiment 5.

In Embodiment 1, heat treatment is performed after selectively doping phosphorous, performing gettering to reduce the catalytic element within the crystalline silicon film.

However, phosphorous may of course be doped into the entire surface. A method of gettering by coming into contact with a high temperature sulfuric acid in the liquid phase is shown in Embodiment 5.

First, the state of FIG. 3A is obtained in accordance with the processes of Embodiment 1. The substrate is then soaked in a liquid (a sulfuric acid solution is used in Embodiment 5) heated to 300° C., and the nickel used in crystallization is either removed or reduced. Note that there is no special limitation to the method of contacting the semiconductor layers with sulfuric acid.

By thus performing the catalytic element reduction process using the liquid phase, the catalytic element concentration can be reduced in a short amount of time. Subsequent processes may be performed in accordance with those of Embodiment 1 in order to obtain the TFT structure of the present invention.

Note that it is possible to freely combine the constitution of Embodiment 5 with the constitution of any of embodiments 1 to 4.

Embodiment 6

Figure 10:
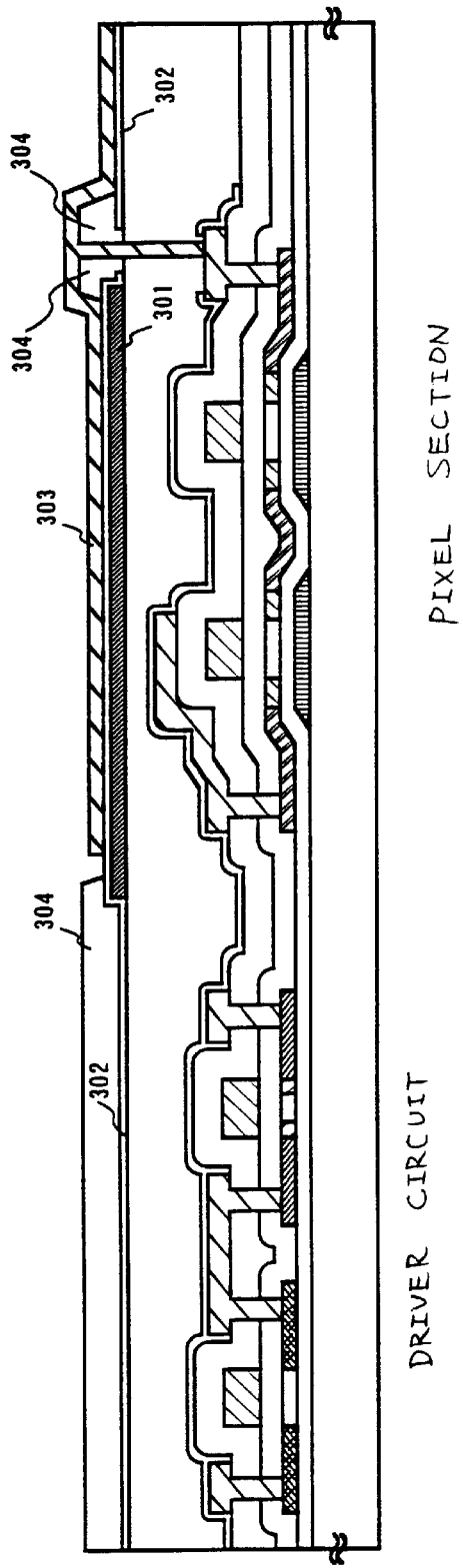
FIG. 10 is a diagram showing the cross sectional structure of an AM-LCD.

An example of using a shielding layer (also referred to as a black mask) 301 having conducting properties as a substitute for the transparent electrode 125 of Embodiment 1 is explained in Embodiment 6 with reference to FIG. 10. The shielding layer provides a shield from external light, and at the same time has an electric field shielding effect.

First, the second interlayer insulating film is formed in accordance with Embodiment 1. A metallic film containing titanium as its principal constituent is then deposited by sputtering, and patterning is performed, forming the black mask 301 covering the pixel TFT. When using an organic resin in the second interlayer insulating film, plasma processing using $CF_4$ gas may be performed in order to increase the adhesion with the metallic film, and that a thin insulating film which becomes a buffer layer may be formed by sputtering on the second interlayer insulating film.

A silicon oxide film 302 is formed on the black mask 301 by sputtering, similar to Embodiment 1. The black mask 301 becomes the lower electrode of a holding capacitor, and the silicon oxide film 302 becomes the dielectric of the holding capacitor. Note that the black mask 301 is either set to a fixed electric potential, or is left in a floating state (an electrically independent state).

The silicon oxide film 302 is then selectively removed in order to make later formation of a contact hole for the pixel electrode and the drain electrode easy. An organic resin film is then formed. The organic resin film on top of the black mask is selectively removed at the same time as the contact hole is formed, forming a third interlayer insulating film 304. The third interlayer insulating film 304 fulfills a role of effectively preventing short circuits developing between the black mask 301 and a pixel electrode 303.

Finally, the pixel electrode 303 is formed from a transparent conductive film. The pixel electrode 303 becomes the upper electrode of the holding capacitor.

It is possible to form an ample holding capacitor by using this structure, and deterioration of the TFT due to light can be prevented.

Further, a silicon oxide film formed by sputtering is used in Embodiment 6, but the black mask may be oxidized by an oxidation method such as high voltage oxidation or anodic oxidation, and the oxide film may be used as the dielectric, thereby increasing throughput.

Note that it is possible to freely combine the constitution of Embodiment 6 with the constitution of any of embodiments 1 to 5.

Embodiment 7

Figure 11:
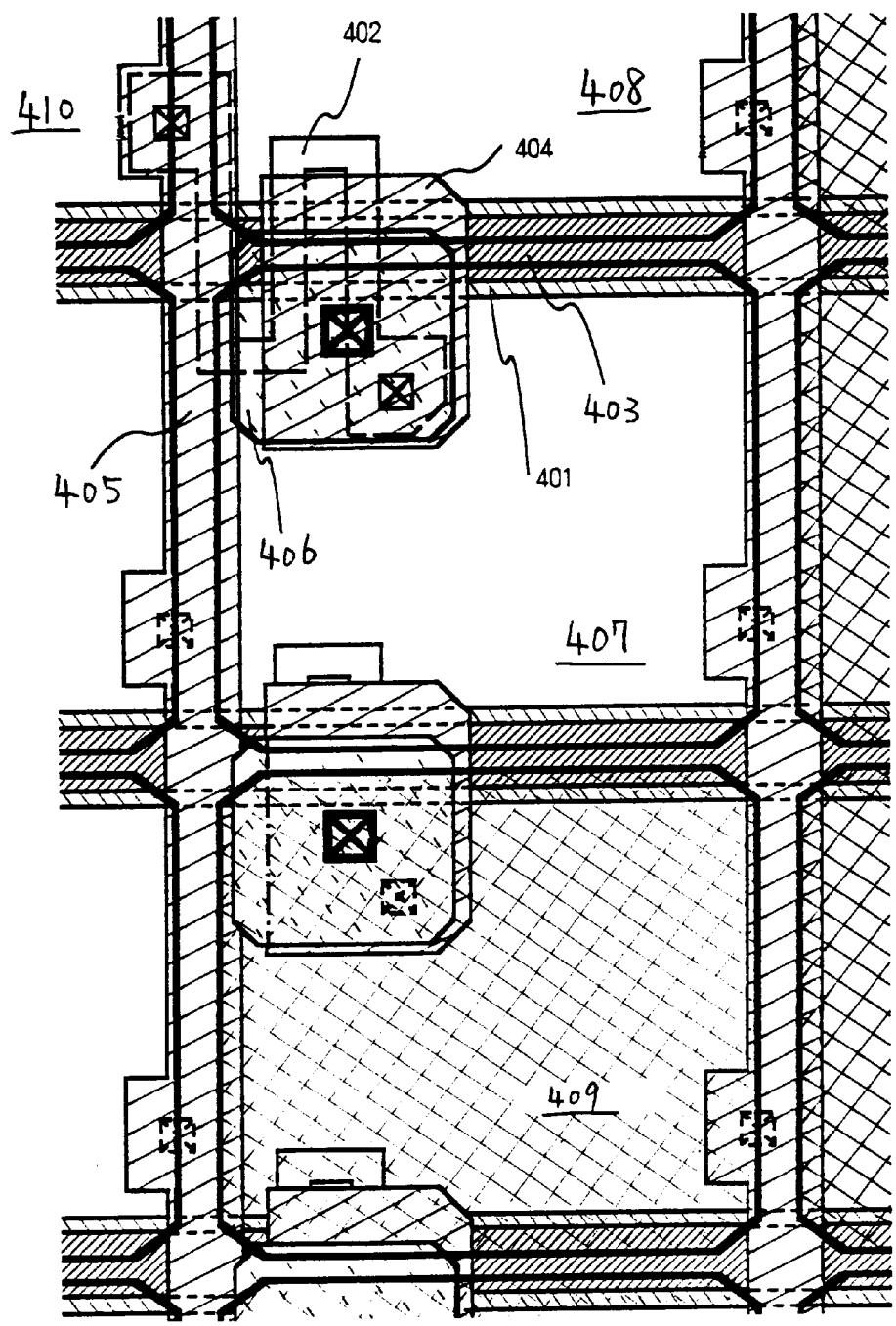
FIG. 11 is a diagram showing the upper face structure of a pixel section.

In Embodiment 7, an example of a specific pixel section structure (a triple gate structure) is shown in FIG. 11. A shielding layer 401 is formed below a semiconductor layer 402, and a gate wiring 403 is formed on the semiconductor layer 402. The line width of the shielding film 401 is made wider than the line width of the gate wiring 403 in the present invention. Reference numeral 404 denotes a drain electrode, 405 denotes a source wiring, 406 denotes an insulating layer, and 407 denotes a pixel electrode. Note that pixel electrode 409 is shown by a cross-hatched pattern, and that the pixel electrodes 407, 408, and 410 are shown by the region enclosed by a bold line, for simplicity.

Figure 12:
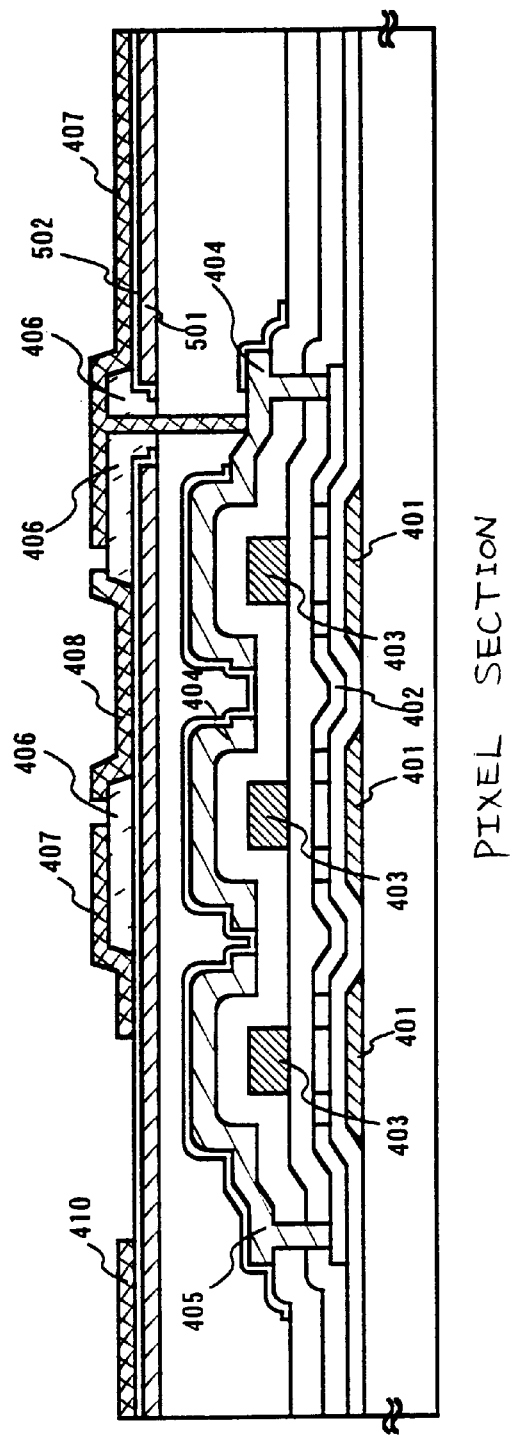
FIG. 12 is a diagram showing the cross sectional structure of a pixel section.

A cross sectional diagram corresponding to FIG. 11 is shown in FIG. 12. In addition, the same symbols from FIG. 11 are used in FIG. 12. Note that a transparent conductive film 501 is either set to a fixed electric potential, or is left in a floating state (an electrically independent state). A holding capacitor is formed by the transparent conductive film 501, an insulating film 502, and the pixel electrode 407.

In contrast with the double gate structure of Embodiment 1, the TFT in Embodiment 7 has a triple gate structure, but the basic structure is the same. Therefore, the manufacturing processes shown by Embodiment 1 may be used to obtain the structure of FIG. 11 and FIG. 12.

Note that it is possible to freely combine the constitution of Embodiment 7 with the constitution of any of embodiments 1 to 6.

Embodiment 8

A case of actually manufacturing an AM-LCD by forming a TFT by the manufacturing processes shown in Embodiment 1 is explained in Embodiment 8.

The state of FIG. 5C is obtained in accordance with Embodiment 1, and an oriented film is formed to a thickness of 80 nm on the pixel electrode 240. A glass substrate with a color filter, a transparent electrode (opposing electrode) and an oriented film formed on top is prepared as an opposing substrate, and a rubbing process is performed on each of the oriented films. The substrate on which the TFT is formed and the opposing substrate are then joined together using a sealing material (sealant). A liquid crystal is then held between the substrates. A known means may be used for this cell assembling process, so a detailed explanation is omitted.

Note that spacers may be formed if necessary in order to maintain a cell gap. Therefore, spacers need not be formed for cases in which the cell gap can be maintained without spacers, as in an AM-LCD with a 1 inch or smaller diagonal.

Figure 13:
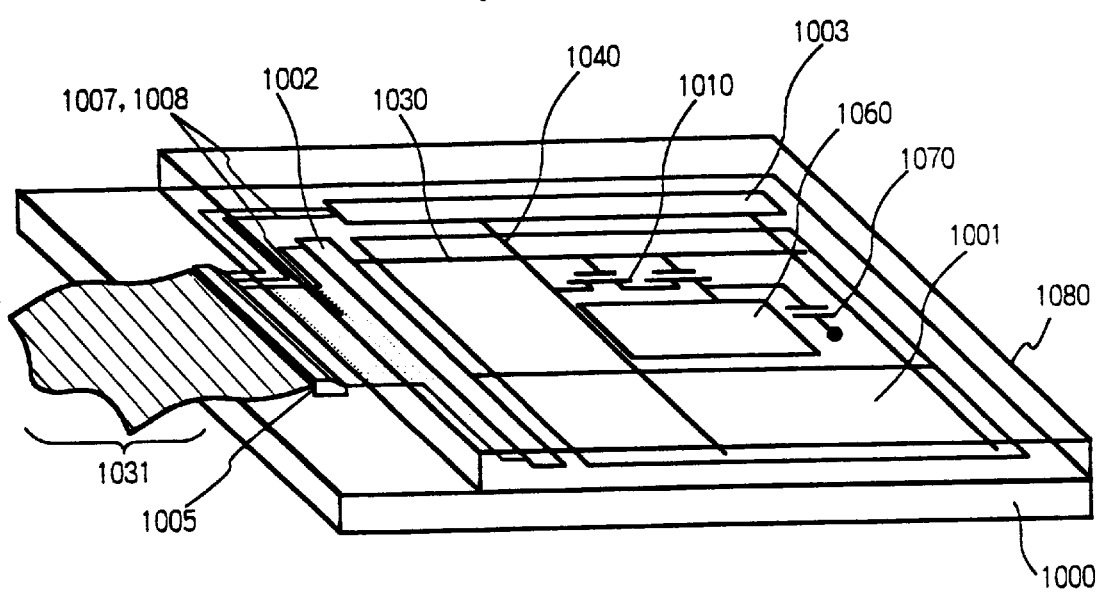
FIG. 13 is a diagram showing an external view of an AM-LCD.

An external view of an AM-LCD manufactured as above is shown in FIG. 13. An active matrix substrate and the opposing substrate face each other as shown in FIG. 13, and the liquid crystal is sandwiched between the substrates. The active matrix substrate has a pixel section 1001, a scanning line side driver circuit 1002, and a signal line side driver circuit 1003 formed on a substrate 1000.

The scanning line side driver circuit 1002 and the signal line side driver circuit 1003 are connected to the pixel section 1001 by a scanning line 1003 and a signal line 1040, respectively. The driver circuits 1002 and 1003 are mainly composed of CMOS circuits.

Scanning lines are formed for each row of the pixel section 1001, and a signal line 1040 is formed for each column. A pixel TFT 1010 is formed near the intersection of the scanning line 1030 and the signal line 1040. The gate electrode of the pixel TFT 1010 is connected to the scanning line 1030, and the source is connected to the signal line 1040. In addition, a pixel electrode 1060 and a holding capacitor 1070 are connected to the drain of the pixel TFT.

An opposing substrate 1080 has a transparent conductive film such as an ITO film on the entire surface of the substrate. The transparent conductive film is an opposing electrode corresponding to the pixel electrode 1060 of the pixel section 1001, and the liquid crystal material is driven by an electric field formed between the pixel electrode and the opposing electrode. An oriented film, a black mask, and a color filter may be formed on the opposing substrate 1080 according to the need.

An FPC 1031 is attached to an external output terminal 1005 on the active matrix side substrate, and wirings 1007 and 100 8 are formed for connecting the driver circuits and the external output terminal. An IC chip structured by circuits such as a video signal processing circuit, a timing pulse generator circuit, a γ compensation circuit, a memory circuit, or an arithmetic circuit formed on a silicon substrate may be installed.

It is possible to use many types of liquid crystal materials in a liquid crystal display device manufactured by Embodiment 8 above, in addition to a TN liquid crystal. For example, it is possible to use the liquid crystals disclosed in: Furue, H, et al., "Characteristics and Driving Scheme of Polymer-stabilized Monostable FLCD Exhibiting Fast Response Time and High Contrast Ratio with Gray-scale Capability," SID, 1998; Yoshida, T., et al., "A Full-color Thresholdless Antiferroelectric LCD Exhibiting Wide Viewing Angle with Fast Response Time," SID Digest, 841, 1997; Innui, S., et al. , "Thresholdless antiferroelectricity in liquid crystals and its application to displays" J. Mater. Chem., 6(4), 671–673, 1996; and U.S. Pat. No. 5,594.569.

In addition, a liquid crystal display device is given as an example and explained in Embodiment 8, but it is possible to apply the present invention to an EL (electroluminescence) display device, or to an EC (electrochromic) display device, provided that it is an active matrix type display device.

Note that it is possible to freely combine the constitution of Embodiment 8 with the constitution of any of embodiments 1 to 7.

Embodiment 9

An example of the manufacture of an EL (electroluminescence) display device using the present invention is explained in Embodiment 9.

Figure 14:
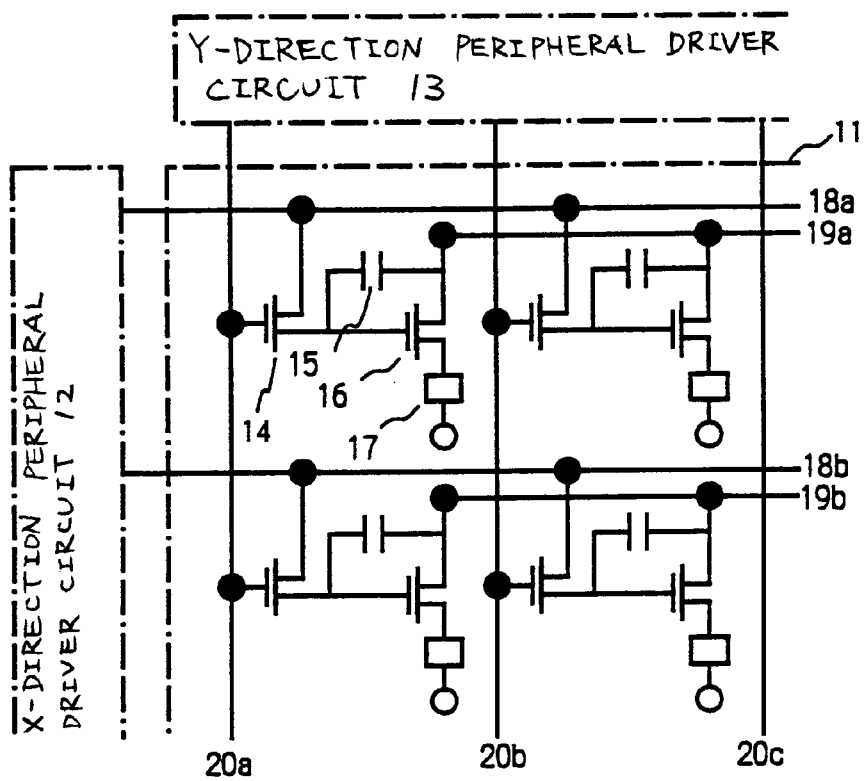
FIG. 14 is a circuit diagram of an EL panel.

An example of applying the invention to an active matrix type EL display is shown in FIG. 14.

FIG. 14 is a circuit diagram of an active matrix type EL display device. Reference numeral 11 denotes a display region, and an x-direction peripheral driver circuit 12 and a y-direction peripheral driver circuit 13 are formed in the periphery. Further, each pixel in the display region 11 has a switching TFT 14, a capacitor 15, a current control TFT 16, and an organic EL device 17. The switching TFT 14 is connected to an x-direction signal line 18a (or 18B) and to a y-direction signal line 20a (or 20b, 20c). Furthermore, power source lines 19a and 19b are connected to the current control TFT 16.

The structure of the TFTs used in the x-direction peripheral driver circuit 12 and in the y-direction peripheral driver circuit 13 of the active matrix type EL display in Embodiment 9 have the GOLD structure, while the switching TFT 14 and the current control TFT 16 have the LDD structure.

Figure 15A:
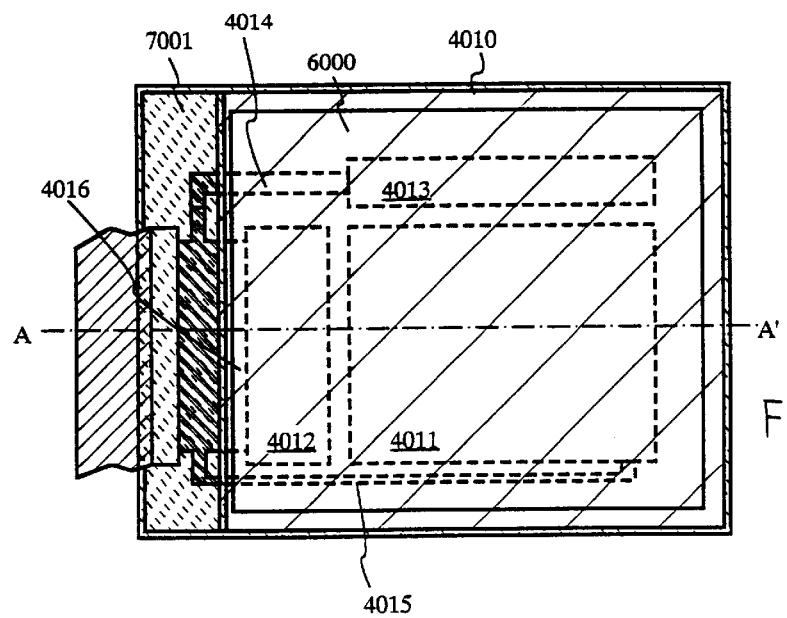
FIGS. 15A and 15B are a upper surface diagram and a cross sectional diagram, respectively, of an EL panel.

FIG. 15A is a top view of an EL display device using the present invention. In FIG. 15A reference numeral 4010 denotes a substrate, 4011 denotes a pixel section, 4012 denotes a source line side driver circuit, and 4013 denotes a gate line side driver circuit. Both drive circuits lead to an FPC 4017 through gate wirings 4014 to 4016, and thus connect to external equipment.

A cover 6000, a sealing material (also called a housing material) 7000, and a sealant (a second sealing material) 7001 should be formed around at least the pixel section, and preferably around both the pixel section and the drive circuits at this point.

Figure 15B:
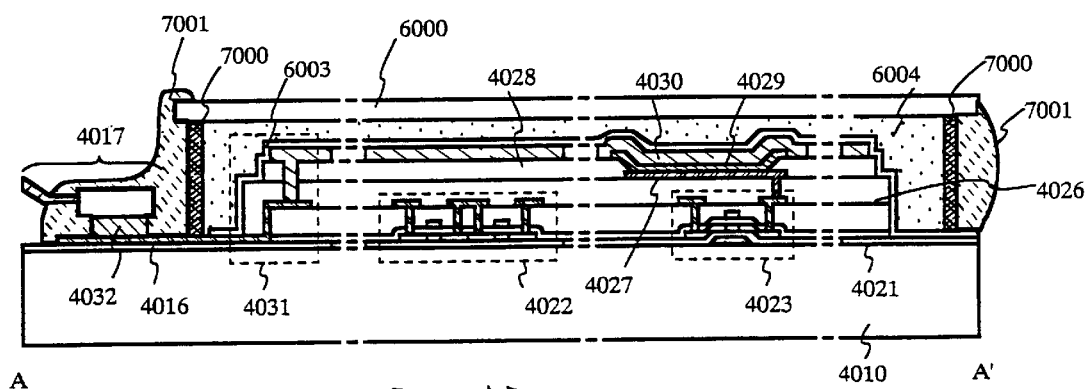

In addition, FIG. 15B shows the cross sectional structure of the EL display device of Embodiment 9. A driver circuit TFT 4022 (Notice: shown here is a CMOS circuit having a combination of an n-channel type TFT and a p-channel type TFT) and a pixel section TFT 4023 (Notice: only a TFT for controlling current flowing into an El element is shown here) are formed on the substrate 4010 and a base film 4021.

The present invention can be used for the driver circuit TFT 4022 and for the pixel section TFT 4023.

After completing the driver circuit TFT 4022 and the pixel section TFT 4023 using the present invention, a pixel electrode 4027 is formed by a transparent conductive film, on an interlayer insulating film (a leveling film) 4026 made of a resin material, in order to electrically connect to the drain of the pixel section TFT 4023. An indium oxide and tin oxide compound (called ITO), or an indium oxide and zinc oxide compound can be used as the transparent conductive film. Then, after forming the pixel electrode 4027, an insulating film 4028 is formed, and an open section is formed in the pixel electrode 4027.

An EL layer 4029 is formed next. Any known EL materials (hole injection layer, hole transport layer, illumination layer, electron transport layer, electron injection layer) may be freely combined to form as the EL layer 4029 a laminate structure or a single layer structure. A known technique may be used to determine the structure type. Further, there are low molecular weight materials and high molecular weight materials (polymers) as EL materials. An evaporation method is used for low molecular weight materials, but it is possible to use an easy method such as spin coating, printing, or ink jet for high molecular weight materials.

The EL layer is formed in Embodiment 9 by an evaporation method using a shadow mask. By using a shadow mask and forming a luminescence layer that can emit different wavelengths of light for each pixel (red light emitting layer, green light emitting layer, and blue light emitting layer), color display is possible. Any other form may be used, such as combining color changing layers (CCM) with color filters, and combining white light emitting layers with color filters. Of course a single color light EL display device is also possible.

After forming the EL layer 4029, a cathode 4030 is formed on top. It is preferable to remove as much as possible of the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in Embodiment 9 by using a multi-chamber system (cluster tool system) deposition device.

Note that a laminate structure of a LiF (lithium fluoride) film and an Al (aluminum) film is used for the cathode 4030 in Embodiment 9. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 in the region denoted with the reference numeral 4031. The wiring 4016 is a supply line in order to apply a preset voltage to the cathode 4030, and is connected to the FPC 4017 through a conducting paste material 4032.

In the region denoted by reference numeral 4031, the cathode 4030 and the wiring 4016 were electrically connected, so it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may proceed in one shot all the way to the interlayer insulating film 4026 when etching the insulating film 4028. In this case the contact holes can have a good shape provided that the interlayer insulating film 4026 and the insulating film 4028 are the same resin material.

A passivation film 6003, a filler 6004, and the cover 6000 are formed, covering the surface of the EL device thus formed.

In addition, a sealing material is formed on the inside of the cover 6000 and the substrate 4010, so as to surround the EL device section, and the sealant 7001 (the second sealing material) is formed on the outside of the sealing material 7000.

At this point the filler 6004 also functions as an adhesive in order to bond the cover 6000. PVC (polyvinyl chloride), epoxy resin, silicon resin, PVB (polyvinyl butyral), and EVA (ethylene vinyl acetate) can be used as the filler 6004. If a drying agent is formed on the inside of the filler 6004, a moisture absorption effect can be maintained, and this is preferable.

Further, spacers may be included within the filler 6004. The spacers may be a powdered substance such as BaO, giving the spacers themselves the ability to absorb moisture.

When using spacers, the passivation film 6003 can relieve the spacer pressure. Further, a resin film, etc., can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the cover 6000. Note that if PVB or EVA is used as the filler 6004, it is preferable to use a sheet with a structure in which several tens of μm of aluminum foil is sandwiched by a PVF film or a Mylar film.

However, depending upon the light emission direction from the EL device (the light radiation direction), it is necessary for the cover 6000 to have light transmitting characteristics.

Further, the wiring 4016 is electrically connected to the FPC 4017 through the gap between the sealing material 7000 and the sealant 7001 and the substrate 4010. Note that an explanation of the wiring 4016 has been made, and the wirings 4014 and 4015 are also connected electrically to the FPC 4017 by similarly passing underneath the sealing material 7000 and the sealant 7001.

Note that it is possible to freely combine the constitution of Embodiment 9 with the constitution of any of embodiments 1 to 7.

Embodiment 10

It is possible to use the present invention when forming an interlayer insulating film on a conventional MOSFET, and then forming a TFT on that. In other words, it is possible to realize a semiconductor device with a three dimensional structure in which a reflective type AM-LCD is formed on a semiconductor circuit.

In addition, the semiconductor circuit may be formed on an SOI substrate such as a SIMOX substrate, Smart-Cut (a trademark of SOITEC corporation), ELTRAN (a trademark of Cannon, Inc.), etc.

Note that it is possible to combine the constitution of any of embodiments 1 to 8 upon carrying out the present embodiment.

Embodiment 11

A CMOS circuit and a pixel section formed through carrying out the present invention may be applied to various electro-optical devices (active matrix type liquid crystal displays, active matrix type EL displays, active matrix type EC displays). Namely, the present invention may be embodied in all the manufacturing processes for the electronic equipments that incorporate those electro-optical devices as display unit.

As such an electronic equipment, a video camera, a digital camera, a projector (rear-type or front-type projector), a head mount display (goggle-type display), a navigation system for vehicles, a stereo for vehicles, a personal computer, and a portable information terminal (a mobile computer, a cellular phone, or an electronic book, etc.) may be enumerated. Examples of those are shown in FIGS. 16A to 16F, FIGS. 17A to 17D, and FIGS. 18A to 18C.

FIG. 16A shows a personal computer comprising a main body 2001, an image inputting unit 2002, a display unit 2003, and a key board 2004 and the like. The present invention is applicable to the image inputting unit 2002, the display unit 2003, and other signal control circuits.

FIG. 16B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

FIG. 16C shows a mobile computer comprising a main body 2201, a camera unit 2202, an image receiving unit 2203, an operation switch 2204, and a display unit 2205 and the like. The present invention is applicable to the display unit 2205 and other signal control circuits.

FIG. 16D shows a goggle-type display comprising a main body 2301, a display unit 2302 and arm portions 2303 and the like. The present invention is applicable to the display unit 2302 and other signal control circuits.

FIG. 16E shows a player that employs a recoding medium in which programs are recorded (hereinafter referred to as a recording medium), and comprises a main body 2401, a display unit 2402, a speaker unit 2403, a recording medium 2404, and an operation switch 2405 and the like.

Incidentally, this player uses as the recoding medium a DVD (digital versatile disc), a CD and the like to serve as a tool for enjoying music or movies, for playing video games and for connecting to the Internet. The present invention is applicable to the display unit 2402 and other signal control circuits.

FIG. 16F shows a digital camera comprising a main body 2501, a display unit 2502, an eye piece section 2503, operation switches 2504, and an image receiving unit (not shown) and the like. The present invention is applicable to the display unit 2502 and other signal control circuits.

FIG. 17A shows a front-type projector comprising a projection device 2601, a screen 2602 and the like. The present invention is applicable to a liquid crystal display device 2808 that constitutes a part of the projection device 2601 and other signal control circuits.

FIG. 17B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

FIG. 17C is a diagram showing an example of the structure of the projection devices 2601 and 2702 in FIGS. 17A and 17B.

The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 17C, an optical system such as an optical lens, a film having a polarization function, a film for adjusting a phase difference and an IR film may be provided on discretion of a person who carries out the invention.

FIG. 17D is a diagram showing an example of the structure of the light source optical system 2801 in FIG. 17C. In this embodiment, the light source optical system 2801 comprises a reflector 2811, light source 2812, lens arrays 2813 and 2814, a polarization conversion element 2815, and a condenser lens 2816. The light source optical system shown in FIG. 17D is an example thereof, and is not particularly limited. For instance, on discretion of a person who carries out the invention, the light source optical system may be provided with an optical system such as an optical lens, a film having a polarization function, a film for adjusting the phase difference and an IR film.

However, the projector shown in FIG. 17 shows the case in which the electro-optical device of transmission type is employed and an application example using the electro-optical device of reflective type and the EL display device is not illustrated.

Figure 18A:
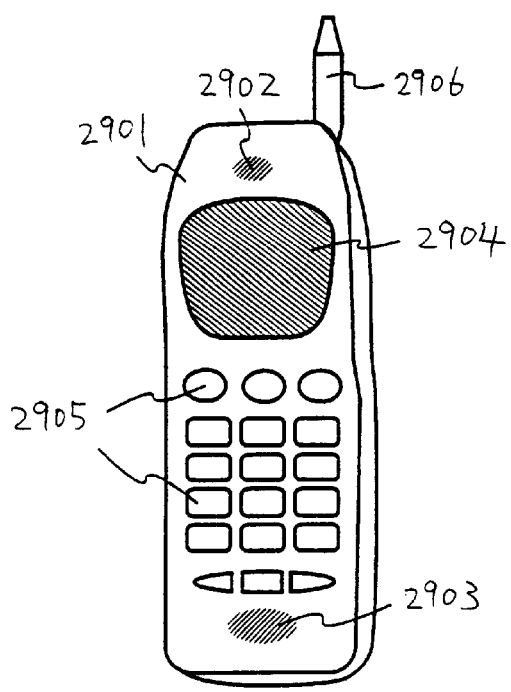
FIGS. 18A to 18C are diagrams showing examples of electronic equipment.

FIG. 18A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 18B:
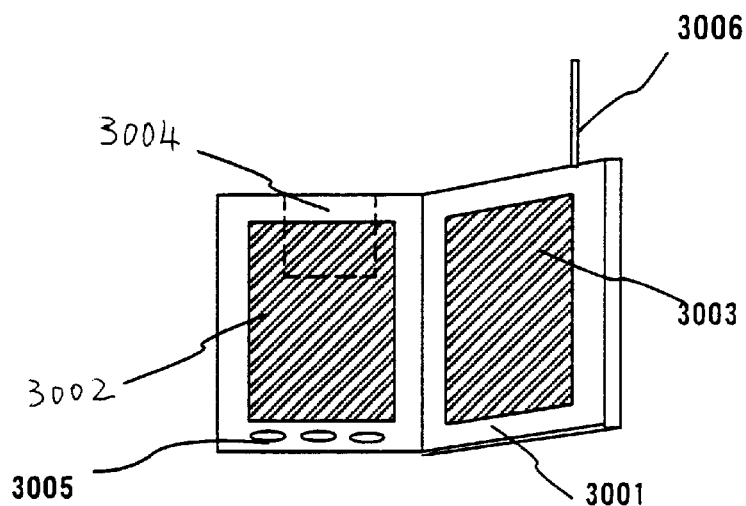

FIG. 18B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and other signal circuits.

Figure 18C:
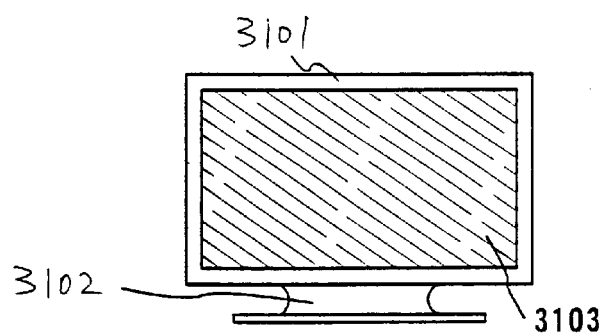

FIG. 18C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in an opposite angle (particularly 30 inches or more).

As described above, application fields of the present invention is extremely broad, thereby being capable of applying the present invention to every field of electronic equipment. In addition, the electronic equipment according to the present embodiment can be embodied by using any constitution comprising any combination of embodiment 1 to 7.

By using the present invention, it is possible to realize an electro-optical device, typically AM-LCD, having high driving performance and high reliability by applying TFTs which place precedence on mobility and TFTs with a small off current, formed on the same substrate, to circuits depending upon their function.

What is claimed is:

1. A semiconductor device comprising:
   a driver circuit and a pixel section formed over the same substrate;
   an n-channel TFT provided in said driver circuit over said substrate comprising a pair of high concentration impurity regions, a channel forming region provided between said high concentration impurity region, and a low concentration impurity region provided between said channel forming region and at least one of said high concentration impurity regions, said high concentration impurity region containing a Group 15 element in the Periodic Table therein; and
   an n-channel TFT provided in said pixel section over said substrate and comprising a pair of high concentration impurity regions, a channel forming region provided between said high concentration impurity region, and a low concentration impurity region provided between said channel forming region and at least one of said high concentration impurity regions, said high concentration impurity region of said n-channel TFT in said pixel section containing a Group 15 element in the Periodic Table therein,
   wherein concentration of said Group 15 element contained in said high concentration impurity region of said TFT in said driver circuit is higher in comparison with concentration of said Group 15 element contained in said high concentration impurity region of said TFT in said pixel section.

2. A semiconductor device comprising:
   a driver circuit and a pixel section formed over the same substrate;
   an n-channel TFT provided in said driver circuit over said substrate comprising a channel forming region, a gate insulating film provided in contact with said channel forming region, and a gate electrode provided in contact with said gate insulating film, a pair of low concentration impurity regions sandwiching said channel forming region, and a high concentration impurity region provided in contact with corresponding one of said low concentration impurity regions, said high concentration impurity region containing a Group 15 element in the Periodic Table therein; and
   an n-channel TFT provided in said pixel section over said substrate and comprising a channel forming region, a gate insulating film provided in contact with said channel forming region, and a gate electrode provided in contact with said gate insulating film, a pair of low concentration impurity regions sandwiching said channel forming region, and a high concentration impurity region provided in contact with corresponding one of said low concentration impurity regions, said high concentration impurity region of said n-channel TFT in said pixel section containing a Group 15 element in the Periodic Table therein, wherein at least one of said low concentration impurity regions of said n-channel TFT in said driver circuit overlaps with said gate electrode of said n-channel TFT of said driver circuit through said gate insulating film of said n-channel TFT of said driver circuit, and wherein concentration of said Group 15 element contained in said high concentration impurity region of said TFT in said driver circuit is higher in comparison with concentration of said Group 15 element contained in said high concentration impurity region of said TFT in said pixel section.

3. A device according to claim 1, wherein the width of said low concentration impurity regions of said n-channel TFT in said driver circuit in channel length direction thereof differs from the width of said low concentration impurity regions of said n-channel TFT in said pixel section in channel length direction thereof.

4. A device according to claim 2, wherein the width of said low concentration impurity regions of said n-channel TFT in said driver circuit in channel length direction thereof differs from the width of said low concentration impurity regions of said n-channel TFT in said pixel section in channel length direction thereof.

5. A device according to claim 1, wherein for said n-channel TFT in said pixel section, a shielding layer is provided over said substrate, an insulating film is provided in contact with said shielding layer, said channel forming region of said n-channel TFT in said pixel section is provided in contact with said insulating film, a gate insulating film is provided in contact with said channel forming region, and a gate electrode provided in contact with the gate insulating film.

6. A device according to claim 2, wherein for said n-channel TFT in said pixel section, a shielding layer is provided over said substrate, an insulating film is provided in contact with said shielding layer, said channel forming region of said n-channel TFT in said pixel section is provided in contact with said insulating film.

7. A device according to claim 5, wherein said shielding layer overlaps with said channel forming region and said low concentration impurity region of said n-channel TFT in said pixel section through said insulating film.

8. A device according to claim 6, wherein said shielding layer overlaps with said channel forming region and said low concentration impurity regions of said n-channel TFT in said pixel section through said insulating film.

9. A device according to claim 5, wherein width of said shielding layer in channel length direction of said n-channel TFT in said pixel section is wider than width of said gate electrode of said n-channel TFT in said pixel section in said channel length direction.

10. A device according to claim 6, wherein width of said shielding layer in channel length direction of said n-channel TFT in said pixel section is wider than width of said gate electrode of said n-channel TFT in said pixel section in said channel length direction.

11. A device according to claim 1 wherein said semiconductor device is selected from the group consisting of a video camera, a digital camera, a projector, a head mount display, a navigation system a personal computer, a portable information terminal, a mobile computer, a cellular phone, and an electronic book.

12. A device according to claim 2 wherein said semiconductor device is selected from the group consisting of a video camera, a digital camera, a projector, a head mount display, a navigation system, a personal computer, a portable information terminal, a mobile computer, a cellular phone, and an electronic book.

\* \* \* \* \*